United States Patent [19]

Fukasawa et al.

[11] Patent Number: 5,611,655
[45] Date of Patent: Mar. 18, 1997

[54] VACUUM PROCESS APPARATUS AND VACUUM PROCESSING METHOD

[75] Inventors: Yoshio Fukasawa, Kofu; Shozo Hosoda, Yamanashi-ken; Tatsuya Nakagome, Yamanashi-ken; Takashi Tozawa, Yamanashi-ken; Koji Suzuki, Yamanashi-ken; Yasumasa Ishihara, Kofu; Minoru Aoyagi; Mahito Kajihara, both of Yamanashi-ken, all of Japan

[73] Assignees: Tokyo Electron Limited, Tokyo; Tokyo Electron Yamanashi Limited, Nirasaki, both of Japan

[21] Appl. No.: 582,805

[22] Filed: Jan. 4, 1996

Related U.S. Application Data

[63] Continuation of Ser. No. 231,169, Apr. 22, 1994, abandoned.

[30]   Foreign Application Priority Data

| Apr. 23, 1993 | [JP] | Japan | 5-120502 |
| Oct. 22, 1993 | [JP] | Japan | 5-287543 |
| Oct. 22, 1993 | [JP] | Japan | 5-287544 |
| Oct. 22, 1993 | [JP] | Japan | 5-287545 |

[51] Int. Cl.$^6$ .................................. B65G 49/07
[52] U.S. Cl. ............... 414/217; 414/416; 414/744.6; 414/939
[58] Field of Search ............... 414/217, 331, 414/403, 416, 743, 744.2, 744.4, 744.5, 744.6, 935, 937, 939, 941

[56]    References Cited

U.S. PATENT DOCUMENTS

| 4,500,407 | 2/1985  | Boys et al. | 414/416 X |
| 4,722,298 | 2/1988  | Rubin et al. | 414/939 X |
| 4,789,294 | 12/1988 | Sato et al. | 414/416 |
| 4,801,241 | 1/1989  | Zajac et al. | 414/217 X |
| 4,951,601 | 8/1990  | Maydan et al. | 414/217 X |
| 5,020,475 | 6/1991  | Crabb et al. | 414/217 X |
| 5,064,340 | 11/1991 | Genov et al. | 414/935 X |
| 5,102,280 | 4/1992  | Poduje et al. | 414/744.6 X |
| 5,186,718 | 2/1993  | Tepman et al. | 29/25.01 |
| 5,202,716 | 4/1993  | Tateyama et al. | 414/217 X |
| 5,297,910 | 3/1994  | Yoshioka et al. | 414/416 X |
| 5,306,380 | 4/1994  | Hiroki | 414/217 X |
| 5,324,155 | 6/1994  | Goodwin et al. | 414/744.5 X |
| 5,336,029 | 8/1994  | Kato et al. | 414/217 |
| 5,364,222 | 11/1994 | Akimoto et al. | 414/941 X |
| 5,388,944 | 2/1995  | Takanabe et al. | 414/217 |
| 5,445,491 | 8/1995  | Nakagawa et al. | 414/939 X |
| 5,478,195 | 12/1995 | Usami | 414/939 X |

FOREIGN PATENT DOCUMENTS

| 4-369851 | 12/1992 | Japan . |
| 5-55354 | 3/1993 | Japan . |
| 5-74748 | 3/1993 | Japan . |

*Primary Examiner*—James W. Keenan
*Attorney, Agent, or Firm*—Oblon, Spivak, McClelland, Maier & Neustadt, P.C.

[57]     ABSTRACT

A vacuum process apparatus includes a convey chamber having a plurality of loading/unloading ports and an airtight structure kept in a vacuum when a target object is conveyed, at least one preliminary vacuum chamber connected to the convey chamber through a loading/unloading port, a plurality of vacuum process chambers connected to the convey chamber through the loading/unloading ports and each having a vacuum process mechanism, a plurality of gate valves for opening/closing the plurality of loading/unloading ports, and a multi-joint arm member, arranged in the convey chamber, for conveying the target object between the convey chamber and the vacuum process chambers, and between the convey chamber and the preliminary chamber. The convey chamber is evacuated through a bearing for a pivot shaft of the multi-joint arm member.

13 Claims, 13 Drawing Sheets

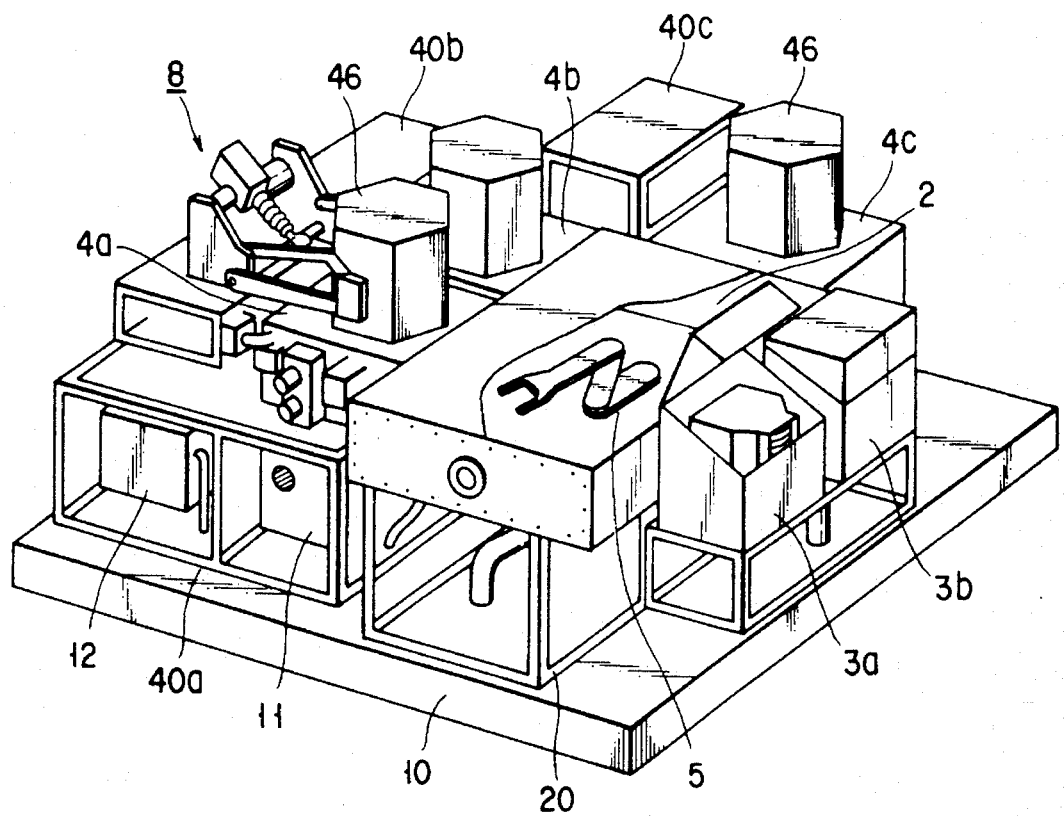
F I G. 1
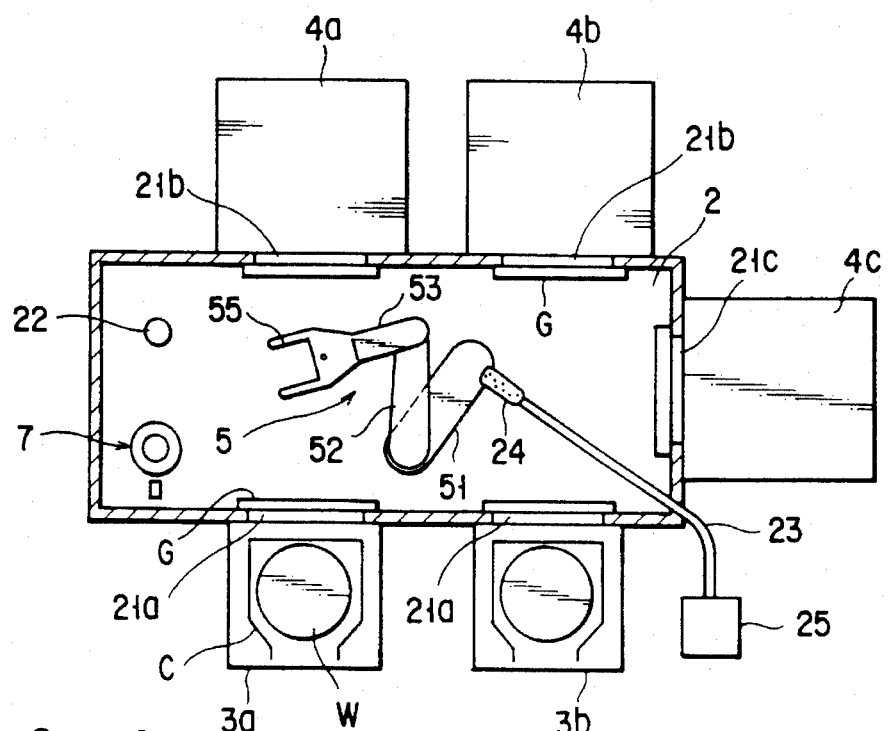
F I G. 2

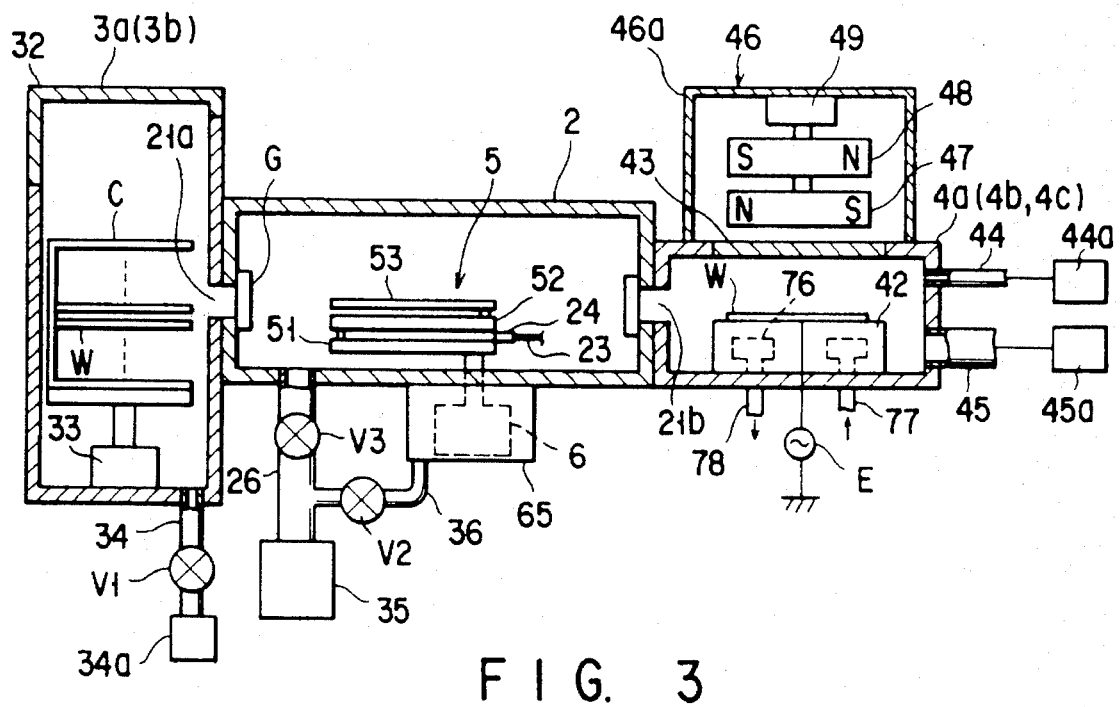
F I G. 3
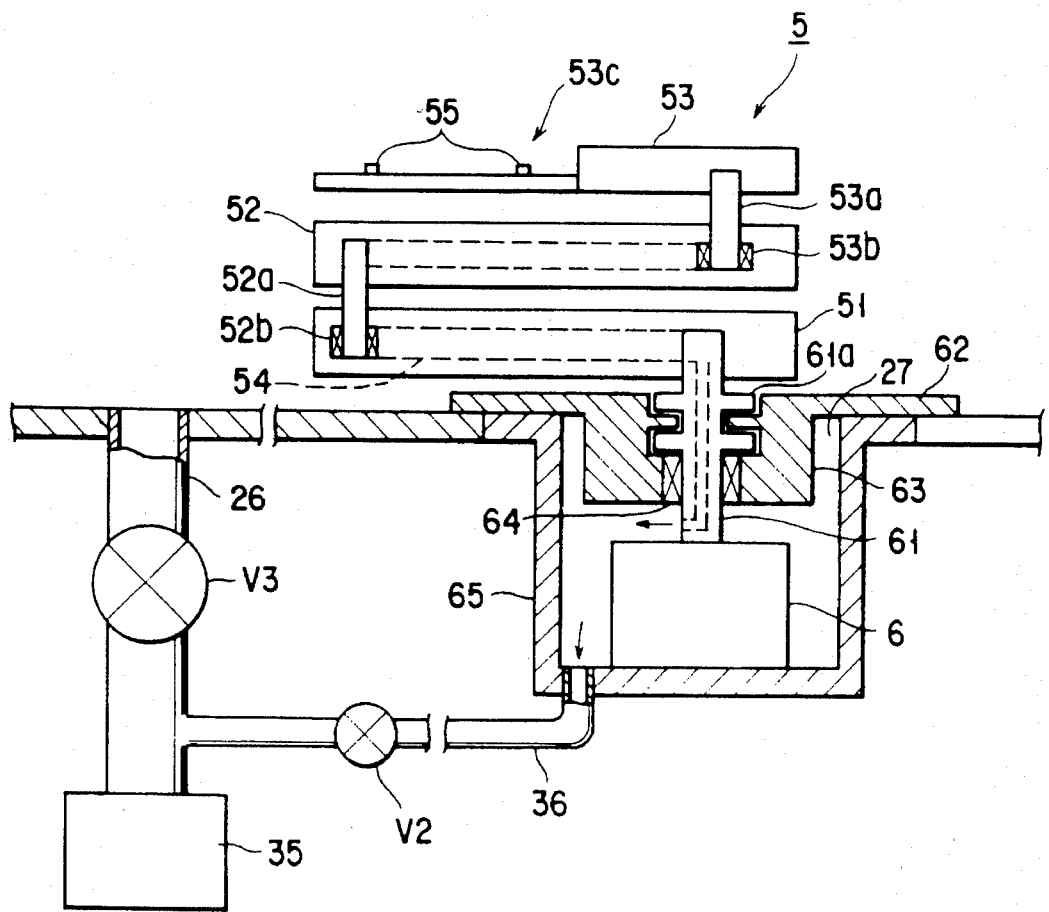
F I G. 4

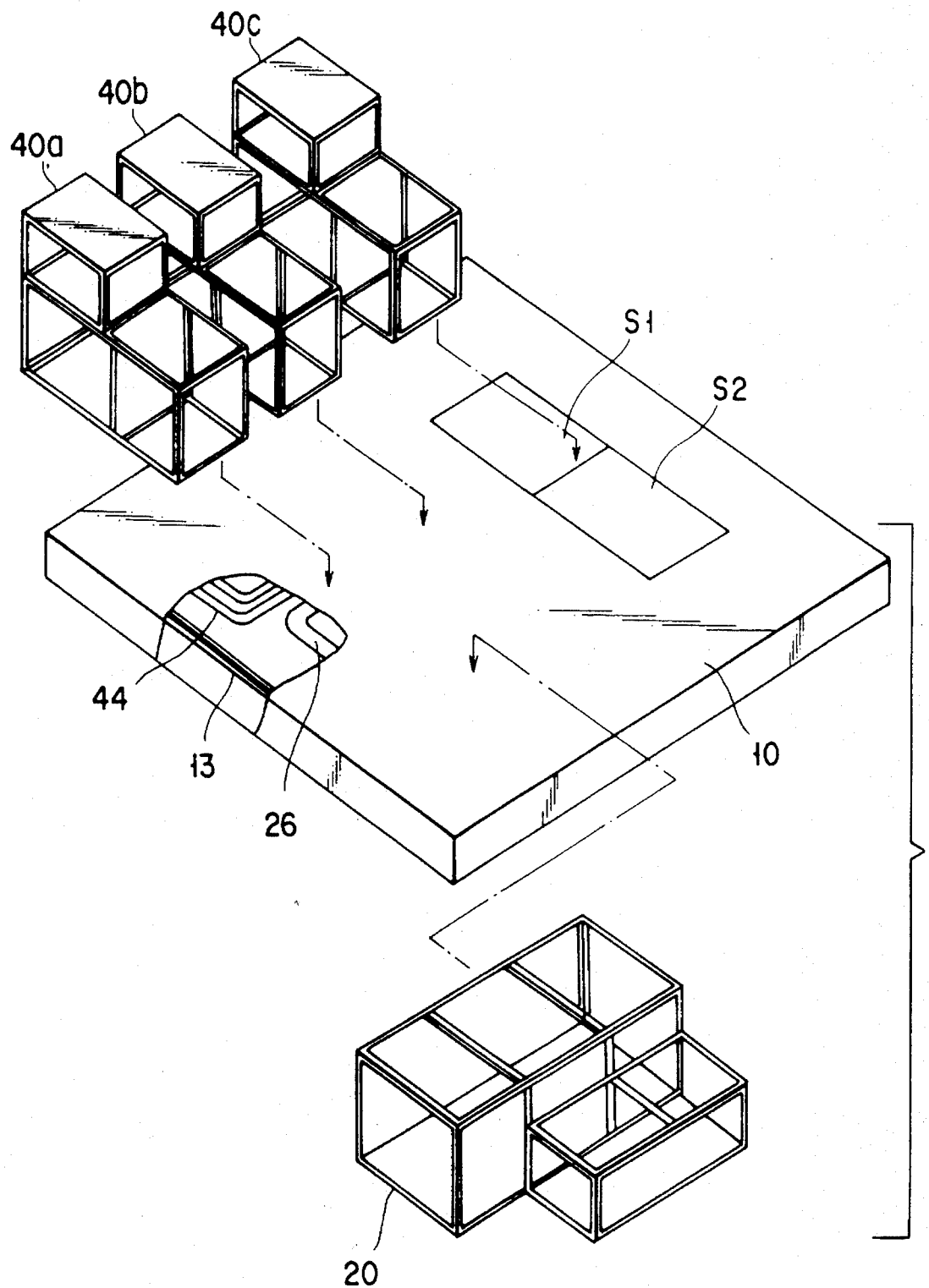
F I G. 5

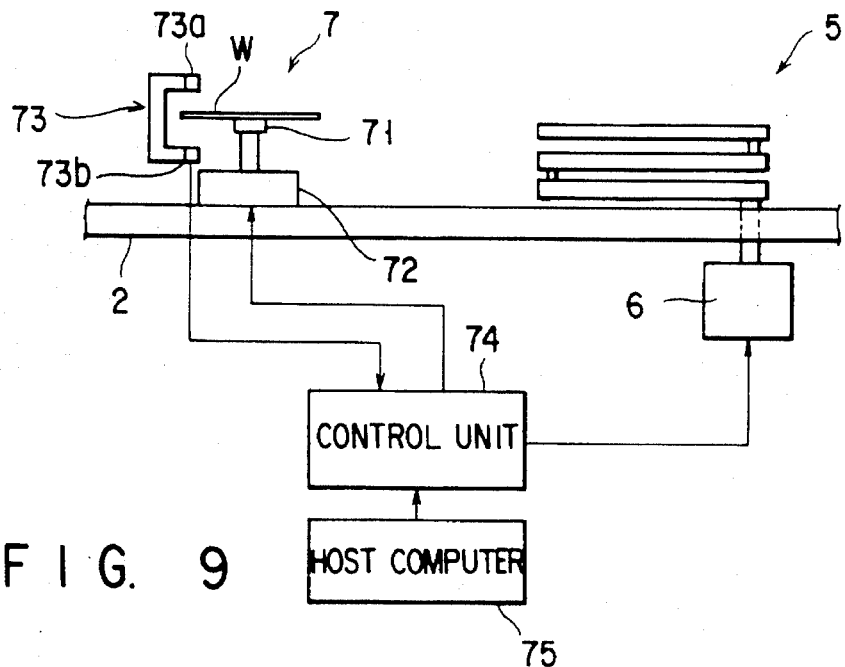
F I G. 9
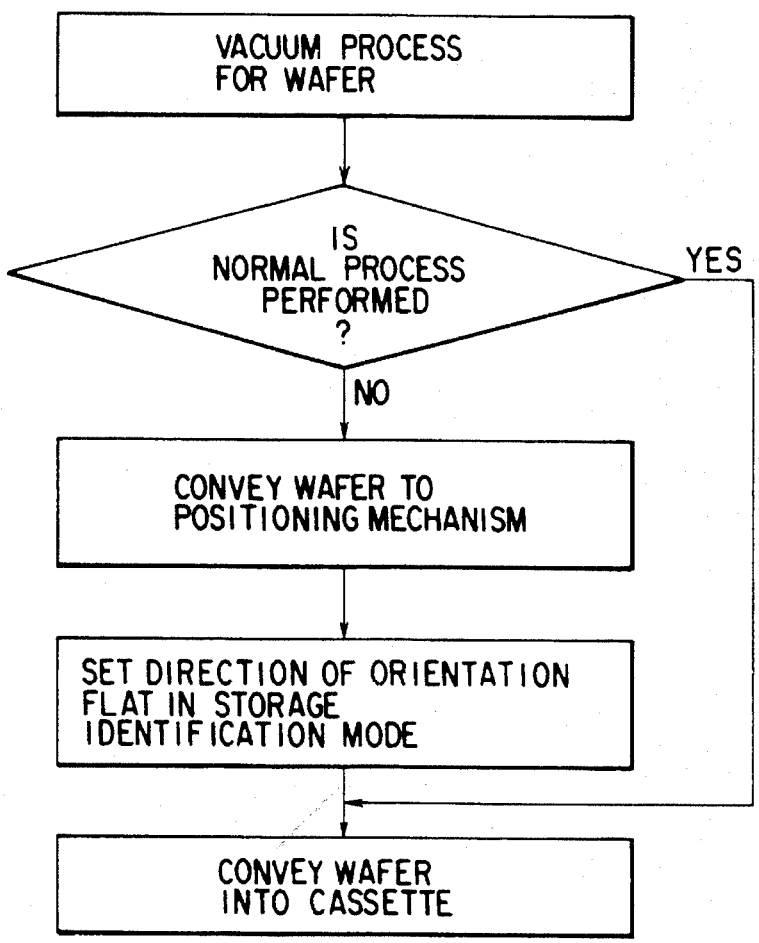
F I G. 10

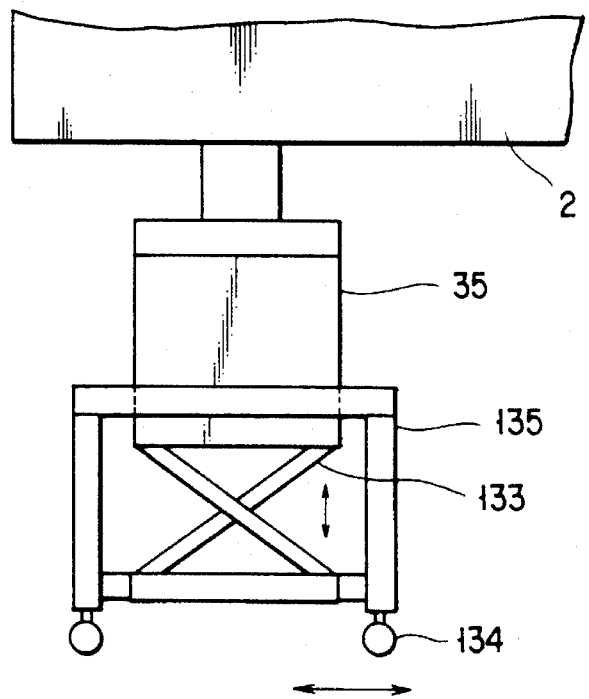
F I G. 14
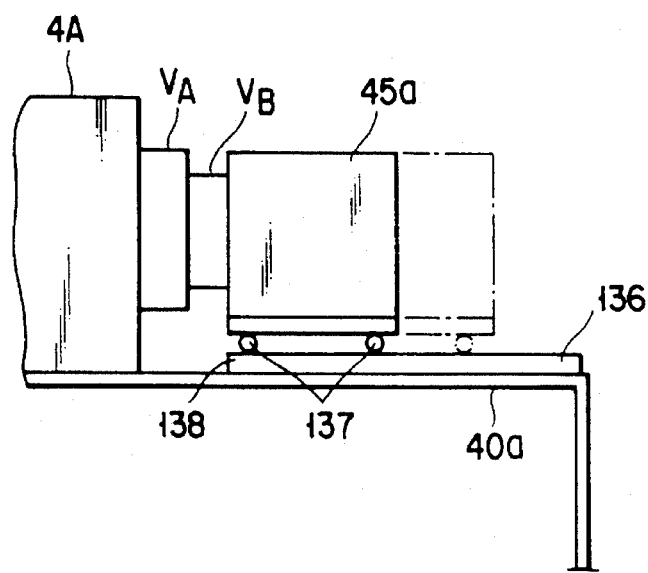
F I G. 15

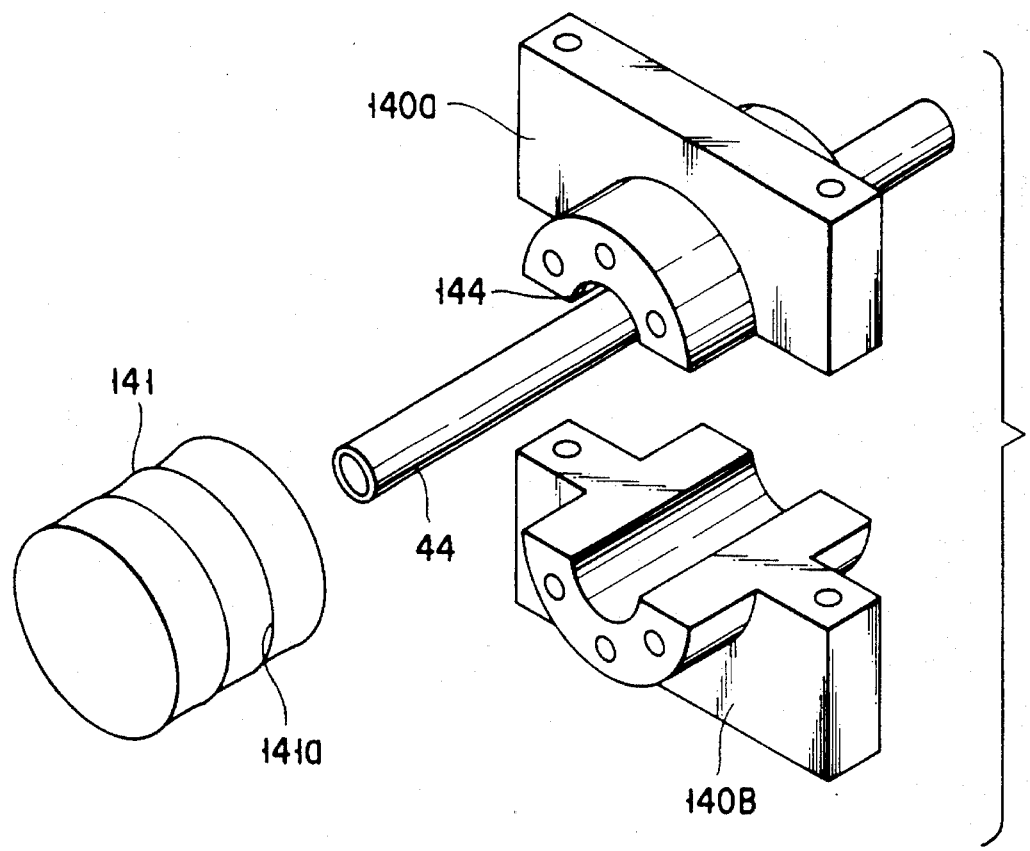
F I G. 17
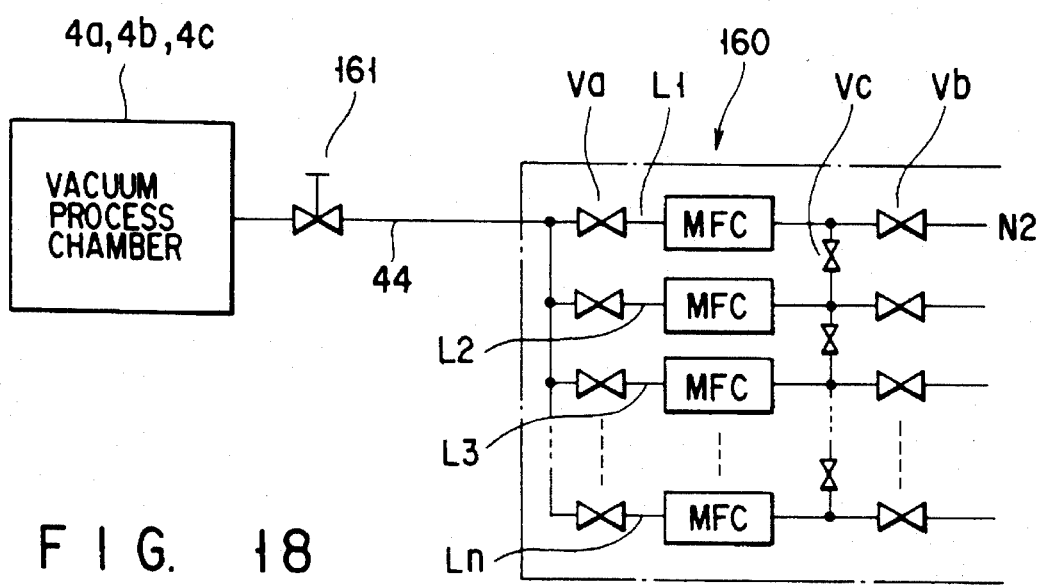
F I G. 18

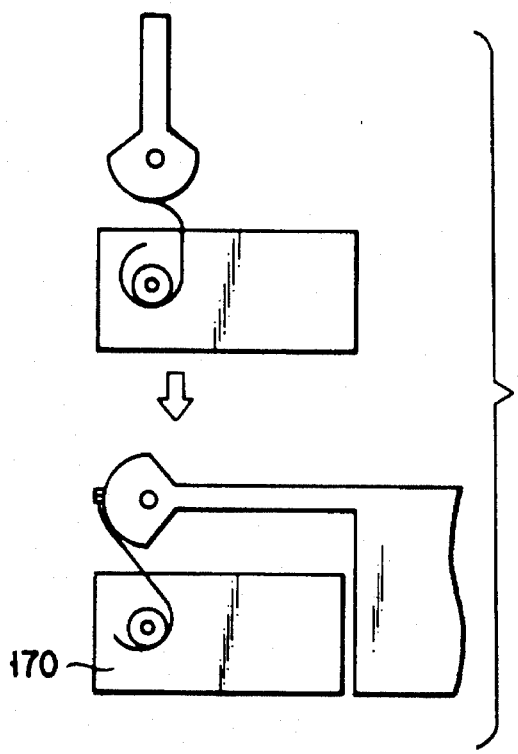
F I G. 20
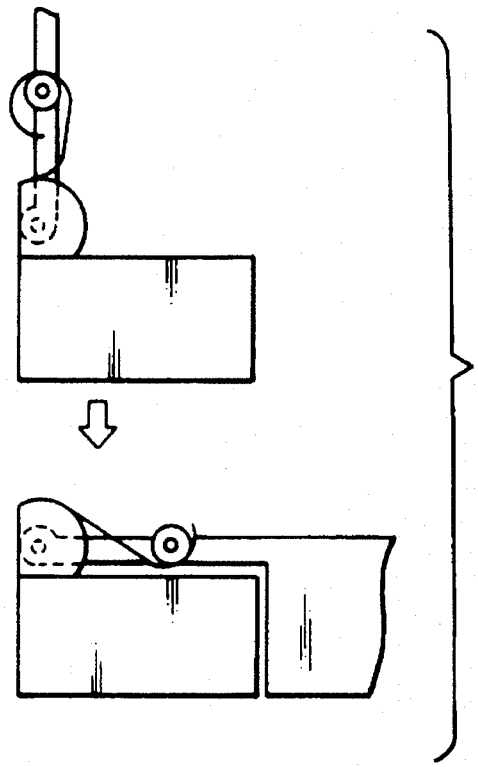
F I G. 21
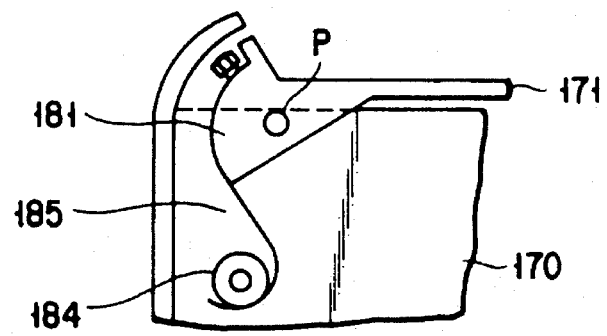
F I G. 22
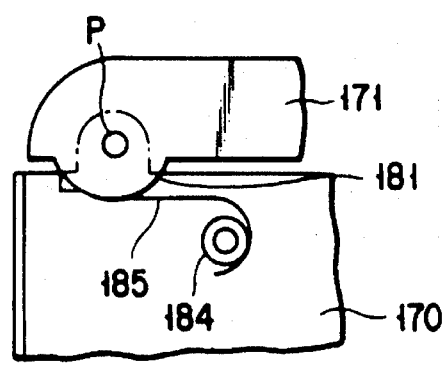
F I G. 23

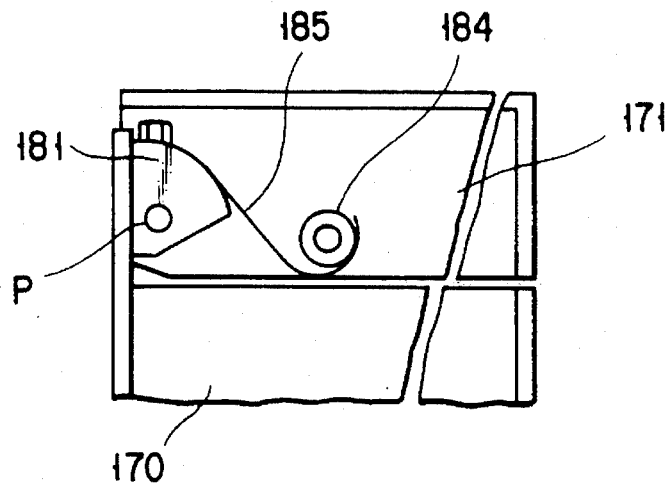
F I G. 24
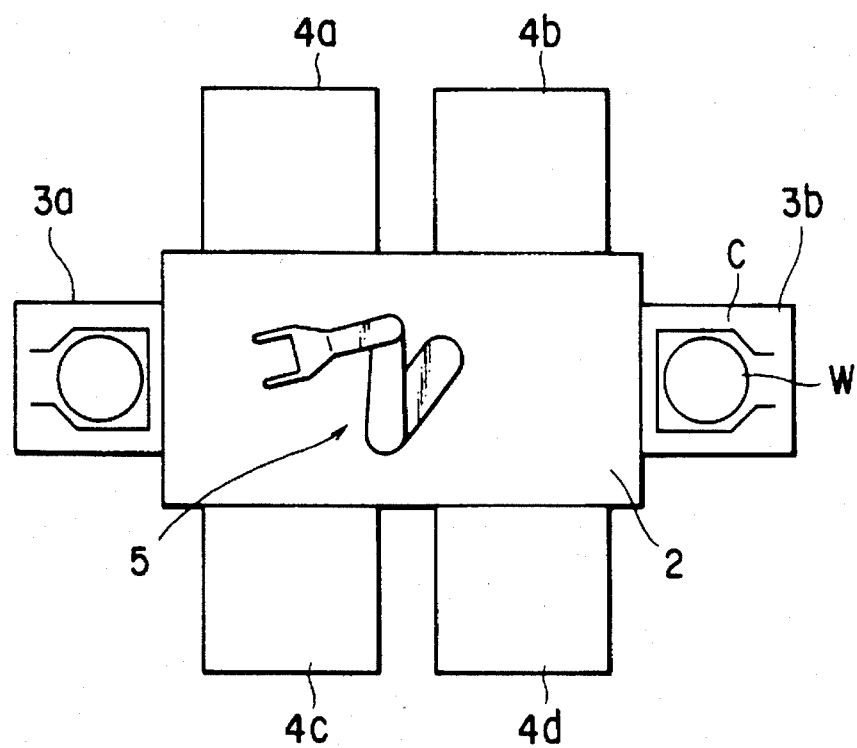
F I G. 25

VACUUM PROCESS APPARATUS AND VACUUM PROCESSING METHOD

This application is a Continuation of application Ser. No. 08/231,169, filed on Apr. 22, 1994, now abandoned.

BACKGROUND OF THE INVENTION

1. Field of the Invention

The present invention relates to a vacuum process apparatus for performing a predetermined vacuum process to a target object such as a semiconductor wafer and a vacuum processing method.

2. Description of the Related Art

Processes in manufacturing a semiconductor include various vacuum processes such as an etching process, a film formation process, an ashing process, and a sputtering process. various vacuum process apparatuses corresponding to these vacuum processes are used. In addition, as these various vacuum process apparatuses, one-by-one type vacuum process apparatuses or batch type vacuum process apparatuses are used. Such a semiconductor manufacturing apparatus is variously devised and improved to cope with a high integration density of a semiconductor and a high throughput. For example, a one-by-one type vacuum process apparatus having the following structure is employed. That is, a plurality of vacuum process chambers are connected to a common convey chamber, and a target object is conveyed into each vacuum process chamber through a common input/output port.

In such an apparatus, a plurality of vacuum process chambers and a cassette chamber are connected to a convey chamber having a convey arm which can be freely reciprocated and rotated, and a wafer cassette in which, e.g., 25 semiconductor wafers are stored is conveyed into a cassette chamber. After the cassette chamber is evacuated, the wafers in the wafer cassette are sequentially conveyed into the vacuum process chambers, and processes are simultaneously performed to the wafers in the vacuum process chambers.

In such an apparatus, unlike in an apparatus in which vacuum process chambers are connected to load lock chambers in a one-to-one correspondence, a convey arm is commonly used in the plurality of vacuum process chambers, thereby achieving a reduction in space. In addition, different processes are performed in the vacuum process chambers, respectively, and one wafer is continuously processed in these process chambers. For this reason, a throughput advantageously increases.

As the convey arm, an arm which is linearly reciprocated is employed. For this reason, the vacuum process chambers and the cassette chamber must be radially arranged with respect to the center of rotation of the convey arm. Although spaces are formed between these chambers, these spaces are dead spaces, and other apparatuses cannot be arranged in the spaces. Therefore, a total space which is actually occupied by the overall apparatus is very large, and the convey arm commonly used in the vacuum process chambers does not provide a great advantage in space. In consideration of arranging the apparatus in an expensive clean room, a reduction in space is further desired.

In addition, since the convey arm is rotatable, a bearing for a rotating shaft must be arranged on the bottom portion in the convey chamber, and particles are easily generated by the bearing when the convey arm is driven. When the degree of micropatterning of devices has increased, countermeasures for removing the particles are required.

SUMMARY OF THE INVENTION

It is an object of the present invention to provide a vacuum process apparatus having a high degree of freedom of the layout of the arrangement of vacuum process chambers and a vessel placing chambers and a high space efficiency.

It is another object of the present invention to provide a vacuum process apparatus capable of suppressing scattering of particles when a convey means in a convey chamber is driven.

It is still another object of the present invention to provide a vacuum processing method which has little contamination to a target object and can perform an efficient process.

According to the first aspect of the present invention, there is provided a vacuum process apparatus comprising: a convey chamber having a plurality of loading/unloading ports and an airtight structure kept in a vacuum when a target object is conveyed; at least one preliminary vacuum chamber connected to the convey chamber through a loading/unloading port; a plurality of vacuum process chambers connected to the convey chamber through the loading/unloading ports and each having a vacuum process mechanism; a plurality of opening/closing means for opening/closing the plurality of loading/unloading ports; and convey means, arranged in the convey chamber and having a multi-joint arm member, for conveying the target object between the convey chamber and the vacuum process chambers, and between the convey chamber and the preliminary chamber.

According to the second aspect of the present invention, there is provided a vacuum process apparatus comprising: a convey chamber having a plurality of loading/unloading ports and an airtight structure kept in a vacuum when a target object is conveyed; at least one preliminary vacuum chamber connected to the convey chamber through a loading/unloading port; a plurality of vacuum process chambers connected to the convey chamber through the loading/unloading ports and each having a vacuum process mechanism; a plurality of opening/closing means for opening/closing the plurality of loading/unloading ports; convey means, arranged in the convey chamber and having a convey arm and a main pivot shaft for horizontally pivoting the convey arm and a bearing portion for the main pivot shaft, for conveying the target object between the convey chamber and the vacuum process chambers, and between the convey chamber and the preliminary chamber; a drive means, arranged outside the convey chamber and connected to the main pivot shaft, for driving the convey means; and evacuation means for evacuating the convey chamber through the bearing portion.

According to the third aspect of the present invention, there is provided a vacuum process apparatus comprising: a convey chamber having a plurality of loading/unloading ports and an airtight structure kept in a vacuum when a target object is conveyed; at least one preliminary vacuum chamber connected to the convey chamber through a loading/unloading port; a plurality of vacuum process chambers connected to the convey chamber through the loading/unloading ports and each having a vacuum process mechanism; a plurality of opening/closing means for opening/closing the plurality of loading/unloading ports; and convey means, arranged in the convey chamber, for conveying the target object between the convey chamber and the vacuum process chambers, and between the convey chamber and the preliminary chamber, wherein the convey chamber has a pressure kept higher than that of each of the preliminary vacuum chamber and the vacuum process chambers.

According to the fourth aspect of the present invention, there is provided a vacuum processing method using a vacuum process apparatus including: a convey chamber having a plurality of loading/unloading ports and an airtight structure kept in a vacuum when a target object is conveyed; at least one preliminary vacuum chamber connected to the convey chamber through a loading/unloading port; a plurality of vacuum process chambers connected to the convey chamber through the loading/unloading ports and each having a vacuum process mechanism; a plurality of opening/closing means for opening/closing the plurality of loading/unloading ports; and convey means, arranged in the convey chamber and having a convey arm and a main pivot shaft for horizontally pivoting the convey arm and a bearing portion for the main pivot shaft, for conveying the target object between the convey chamber and the vacuum process chambers, and between convey chamber and the preliminary chamber, the method comprising the steps of: evacuating the convey chamber through the bearing portion of the main pivot shaft of the convey means; evacuating the preliminary vacuum chamber; conveying the target object from the preliminary vacuum chamber into the convey chamber, while the opening/closing means between the preliminary vacuum chamber and the convey chamber is open; performing positioning of the target object in the convey chamber; evacuating the vacuum process chambers; conveying the target object from the convey chamber into the corresponding one of the evacuated vacuum process chambers, while the opening/closing means between any one of the evacuated vacuum process chambers and the convey chamber is open; and performing a predetermined vacuum process in the corresponding one of the vacuum process chambers.

According to the fifth aspect of the present invention, there is provided a vacuum processing method using a vacuum process apparatus including: a convey chamber having a plurality of loading/unloading ports and an airtight structure kept in a vacuum when a target object is conveyed; at least one preliminary vacuum chamber connected to the convey chamber through a loading/unloading port; a plurality of vacuum process chambers connected to the convey chamber through the loading/unloading ports and each having a vacuum process mechanism; a plurality of opening/closing means for opening/closing the plurality of loading/unloading ports; and convey means, arranged in the convey chamber, for conveying the target object between the convey chamber and the vacuum process chambers, and between the convey chamber and the preliminary chamber, comprising the steps of: evacuating the convey chamber; evacuating the preliminary vacuum chamber; conveying the target object from the preliminary vacuum chamber into the convey chamber, while the opening/closing means between the preliminary vacuum chamber and the convey chamber is open; performing positioning of the target object in the convey chamber; evacuating the vacuum process chambers such that each of the vacuum process chambers has a pressure lower than that of the convey chamber; conveying the target object from the convey chamber into the corresponding one of the evacuated vacuum process chambers, while the opening/closing means between any one of the evacuated vacuum process chambers and the convey chamber is open; and performing a predetermined vacuum process in the corresponding one of the vacuum process chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view showing the entire arrangement of a vacuum process apparatus according to an embodiment of the present invention;

FIG. 2 is transverse sectional view showing the main part of the vacuum process apparatus in FIG. 1;

FIG. 3 is vertical sectional view showing the main part of the vacuum process apparatus in FIG. 1;

FIG. 4 is a sectional view showing the multi-joint arm member in a convey chamber of the vacuum process apparatus in FIG. 1 and a drive unit for the multi-joint arm member;

FIG. 5 is an exploded perspective view showing a support structure in the vacuum process apparatus in FIG. 1;

FIG. 9 is a view showing another example of the positioning mechanism;

FIG. 10 is a flow chart for explaining the operation of the positioning mechanism in FIG. 9;

FIG. 14 is a side view showing an example of the guide mechanism of a vacuum pump;

FIG. 15 is a side view showing another example of the guide mechanism of the vacuum pump;

FIG. 17 is an exploded perspective view showing the fixing portion in FIG. 16;

FIG. 18 is a schematic view showing a gas supply system which can realize a preferable gas supply method;

FIGS. 20 to 24 are views showing other examples of a leaf spring mechanism in a hinge mechanism of the lid portion of the vacuum chamber; and FIG. 25 is a view showing the main part of a vacuum process apparatus according to still another embodiment of the present invention.

DETAILED DESCRIPTION OF THE PREFERRED EMBODIMENTS

Figure 6:
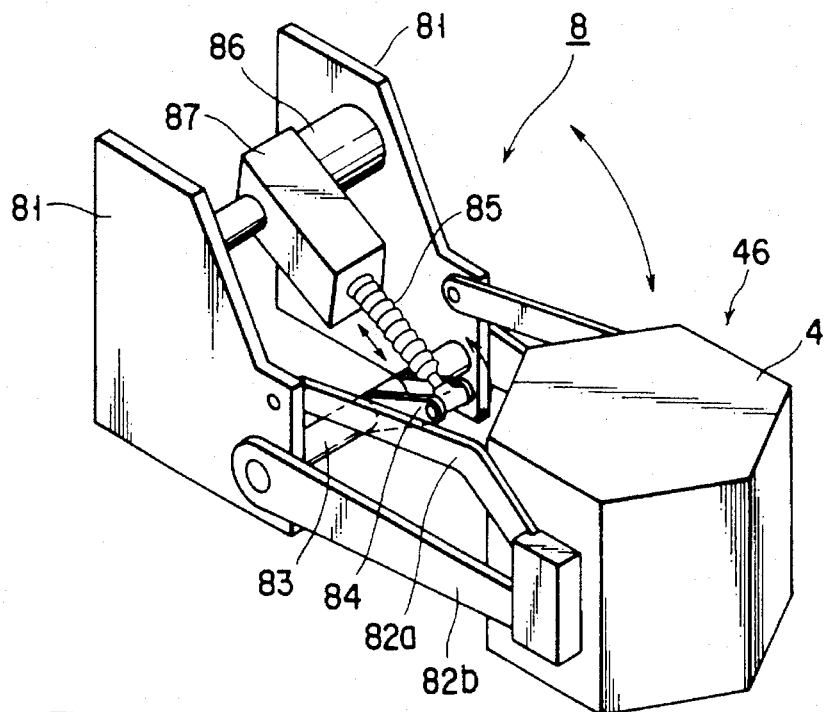
FIG. 6 is a perspective view showing the lift mechanism of a magnet unit in the vacuum process apparatus in FIG. 1.

FIG. 1 is a schematic perspective view showing the entire arrangement of a vacuum process apparatus according to an embodiment of the present invention. In FIG. 1, reference numeral 2 denotes a rectangular-parallelepiped convey chamber having an airtight structure. Around the convey chamber 2, two cassette chambers 3a and 3b each of which has an airtight structure in which wafer cassettes each serving as a vessel for storing 25 wafers W are placed and three vacuum chambers 4a to 4c are arranged adjacent to the convey chamber 2. A multi-joint arm member 5 is arranged in the convey chamber 2, and the wafers W are conveyed between the convey chamber 2 and the cassette chambers 3a and 3b, and between the convey chamber 2 and the vacuum process chambers 4a to 4c using the multi-joint arm member 5.

Magnet units 46 are arranged above the vacuum process chambers 4a, 4b, and 4c, respectively, and as will be described later, magnetron plasma etching apparatuses are constituted by the process chamber and the magnet units.

The convey chamber 2, the cassette chambers 3a and 3b, and the vacuum process chambers 4a to 4c are supported on a base 10 through a plurality of support frames. More specifically, the convey chamber 2 and the cassette chambers 3a and 3b are supported by a support frame 20, and the vacuum process chambers 4a to 4c are supported by support frames 40a to 40c, respectively. A lift mechanism 8 for vertically moving each of the magnet units 46 on the support frames 40a, 40b, and 40c between the upper surface portion of a corresponding one of the vacuum process chambers and the position thereabove is arranged. A matching box 11 used for applying RF power to a vacuum process chamber, a control box 12 for controlling drive units or valves, and the like are stored in the support frames 40a, 40b, and 40c.

As shown in FIG. 2, two wafer loading/unloading ports 21a are formed in the vacuum chamber 2 along one long side thereof, two loading/unloading ports 21b are formed in the convey chamber 2 along the other long side, and one wafer loading/unloading port 21c is formed in the convey chamber 2 along one short side thereof. The cassette chambers 3a and 3b are connected to the two loading/unloading ports 21a, respectively, the vacuum process chambers 4a and 4b are connected to the loading/unloading ports 21b, respectively, and the vacuum process chamber 4c is connected to the loading/unloading port 21c. A gate valve G is arranged at each of the loading/unloading ports. When the gate valves G are closed, the cassette chambers 3a and 3b and the vacuum process chambers 4a to 4c are kept airtight.

Inside the convey chamber 2, the above multi-joint arm member 5 having arms 51 to 53, a vertically movable buffer stage 22 for temporarily placing wafers, and a positioning mechanism 7 for positioning the direction of the orientation flat and the central position of each wafer are arranged.

In addition, in the convey chamber 2, an inert gas supply pipe 23 for supplying an inert gas, e.g., a nitrogen gas, extends to a position above the pivot center of the arm member 5, and an inert gas supply unit 24 consisting of, e.g., a sintered metal, is formed at the distal end portion of the inert gas supply pipe 23. The proximal end side of the inert gas supply pipe 23 is connected to a gas supply source 25, and an inert gas such as a nitrogen gas is supplied from the gas supply source 25 into the convey chamber 2 through the supply pipe 23 and the supply unit 24. Note that the inert gas supply unit 24 functions as a filter, and the inert gas supply unit 24 cleans the inert gas passing through the inert gas supply unit 24.

The cassette chambers and vacuum process chambers are connected to the above convey chamber 2 as shown in FIG. 3.

In the cassette chamber 3a (3b), a wafer cassette C in which, e.g., 25 wafers, are stored is placed. A lid portion 32 which is openable such that the cassette C can be loaded/unloaded is formed at the upper portion of the cassette chamber 3a (3b), and a lift mechanism 33 for intermittently, vertically moving the cassette C is arranged in the cassette chamber 3a (3b). An exhaust pipe 34 is connected to the bottom portion of the cassette chamber 3a (3b). This exhaust pipe 34 is connected to a vacuum pump 34a such as a dry pump through a valve V1. Note that one of the cassette chambers 3a and 3b is used in a loading operation, and the other is used in an unloading operation. In addition, a detection device (not shown) for detecting the states of wafers placed on an inserted cassette is arranged in each of the cassette chambers 3a and 3b.

In the vacuum process chamber 4a (4b or 4c), a lower electrode 42 also serving as a susceptor and an upper electrode 43 are arranged to keep their surfaces horizontal. A process gas supply pipe 44 and an exhaust pipe 45 are connected to the vacuum process chamber 4a (4b or 4c). The process gas supply pipe 44 is connected to a process gas source 44a, and the exhaust pipe 45 is connected to a vacuum pump 45a. The magnet unit 46 is arranged above the upper electrode 43 to be separated from the vacuum process chamber. In a casing 46a, a magnet 47 for forming a magnetic field in the vacuum process chamber 4a (4b or 4c) and a magnet 48 for preventing magnetic leakage are arranged to be rotated by a motor 49. An RF power supply E is connected to the lower electrode 42, and the RF power supply E supplies RF power across the electrodes. Magnetron discharge is generated between these electrodes, and the wafers serving as target objects are subjected to an etching process by a plasma of the lower electrode 42, and a coolant supply pipe 77 and a coolant exhaust pipe 78 are connected to the coolant reservoir 76.

As shown in FIG. 3, the multi-joint arm member 5 in the convey chamber 2 comprises the three convey arms 51, 52, and 53 independently pivoted in the horizontal direction, and the lower arm drive unit 6. An exhaust pipe 26 is connected to the bottom wall of the convey chamber 2, and the exhaust pipe 26 is connected to a vacuum pump 35 such as a turbo pump through a valve V3.

Under the convey chamber 2, the drive unit 6 for driving the multi-joint arm member 5 is arranged in a case 65 having an airtight structure. This case 65 is sealed from the atmosphere air. The drive unit 6 has three motors for driving the arms 51, 52, and 52. The above pivot shaft 61 extends from the drive unit 6, and the arm 51 is connected to the pivot shaft 61. Inside the pivot shaft 61, pivot shafts (not shown) for respective driving the upper and intermediate arms 52 and 53 are arranged.

As shown in FIG. 4, a hole portion 27 corresponding to the case 65 is formed in the bottom wall of the convey chamber 2, and a flange portion 62 is detachably arranged on the bottom wall to cover the hole portion 27. A cylindrical portion 63 extending downward is formed at the central portion of the flange portion 62, and a bearing portion 64 is interposed between the inner wall of the cylindrical portion 63 and the pivot shaft 61. The space in the case 65 is sealed from the atmospheric air.

In the multi-joint arm member 5, as shown in FIG. 4, a pivot shaft 53a and a bearing portion 53b for pivoting the upper convey arm 53 are arranged between the upper and intermediate convey arms 52 and 53, and a pivot shaft 52a and a bearing portion 52b for pivoting the intermediate arm 52 are arranged between the intermediate and lower convey arms 51 and 52. This pivot shaft 52a incorporates a pivot shaft (not shown) for the upper convey arm 53. Inside the intermediate and lower convey arms 51 and 52, a transmission mechanism such as belts and pulleys is incorporated to independently drive the upper and intermediate convey arms 52 and 53 by driving the drive unit 6, and a suction path 54 (indicated by a dotted line) for sucking particles generated by the bearing portions 52b and 53b at the joint portions is formed. This suction path 54 passes through the pivot shaft 61 to open to the inner space of the case 65.

An exhaust pipe 36 is connected to the case 65, and the exhaust pipe 36 is connected to the vacuum pump 35 through a valve V2. Therefore, when the valve V2 is opened, the inner space of the case 65 is evacuated, thereby exhausting particles generated by the bearing portions 64, 52b, and 53b into the exhaust pipe 36 through the inner space of the case 65. In addition, a labyrinth seal is formed between the bearing portion 64 and the convey chamber 2. That is, a projecting portion 61a is formed on the pivot shaft 61, and a hole which is formed in the cylindrical portion 63 and in which the pivot shaft 61 is inserted is curved in accordance with the projecting portion 61a, thereby forming a curved or tortuous exhaust path.

On a wafer holding portion 53c of the upper convey arm 53, projecting portions 55 formed of a material such as fluoroplastics which does not easily generate particles by wear are arranged at three positions which can stably hold a wafer. For this reason, when a wafer is held by the arm 53, a positional error of the wafer and damage to the wafer itself can be prevented.

A support structure for the above vacuum process apparatus will be described below with reference to FIG. 5.

As described above, the convey chamber 2 and the cassette chambers 3a and 3b are supported by the support frame 20, and the vacuum process chambers 4a, 4b, and 4c are supported by the support frames 40a, 40b, and 40c, respectively. These support frames 20 and 40a to 40c are independently formed by assembling frame members and plate members.

These support frames are formed on the base 10. In the base 10, the process gas supply pipe 44, an exhaust pipe (the exhaust pipe 26 of the convey chamber 2 is representatively shown in FIG. 5) for evacuating each chamber, electrical wiring lines 13, and an air pipe (not shown) for operating a solenoid valve extend. As the electrical wiring lines, a power supply line for an RF power supply or the like, a control signal line for each motor or valve, and a detection signal line for detection signal of a temperature or pressure are used. Note that, on the upper surface of the base 10, as representatively indicated by symbols S1 and S2 in FIG. 5, lid plates are arranged in accordance with the layout used when gas pipes and electrical wiring lines are connected, so that maintenance of the inner electrical wiring lines and the like can be performed. In addition, a hole (not shown) for guiding the gas pipes and electrical wiring lines upward is formed.

The lift mechanism 8 for the magnet unit 46 will be described below.

The lift mechanism 8, as shown in FIG. 6, comprises a pair of opposing support plates 81. A pair of arms 82a and 82b extending to the front side and pivotable along the vertical plane are arranged on each of the support plates 81.

The proximal end portion of the upper arm 82a is pivotally supported by the support plate 81, and the distal end portion is pivotally supported on a side surface of the casing 46a of the magnet unit 46. In addition, the lower arm 82b is fixed at an end portion of a pivot shaft 83 pivotally supported between the pair of support plates 81, and the distal end portion of the lower arm 82b is pivotally supported on a side surface of the casing 46a. When the arms 82a and 82b are pivoted, the casing 46a is vertically moved to keep its posture horizontal.

Figure 7A:
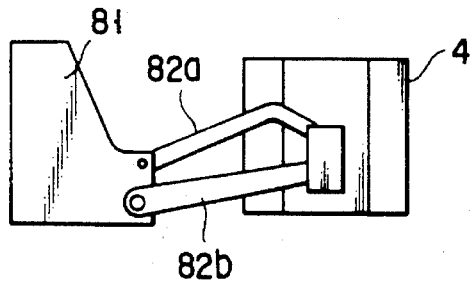
FIGS. 7A and 7B are views for explaining the operation of the lift mechanism.
Figure 7B:
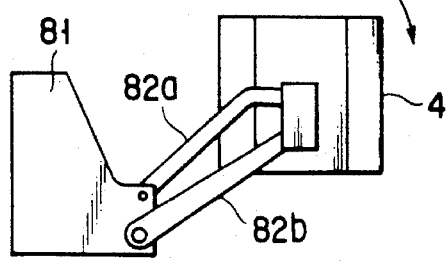

An operating portion 84 projecting obliquely forward is formed at the central portion of the pivot shaft 83, and the lower end of an extendible rod 85 extending from the upper rear portion is pivotally supported at the upper end portion of the operating portion 84. The upper end of the extendible rod 85 is combined with a transmission means 87 for extendibly operating the extendible rod 85 by driving a drive unit 86 fixed on the support plates 81. Therefore, when the extendible rod 85 is retracted, the distal end portion of the operating portion 84 is moved upward, and the pivot shaft 83 is pivoted counterclockwise in FIG. 3. In this manner, the arms 82a and 82b are pivoted upward to move the casing 46a upward as shown in FIG. 7A. When the extendible rod 85 is extended, the casing 46a is moved downward in accordance with operations reverse to those described above, as shown in FIG. 7B. As described above, when the casing 46a is vertically moved, unlike a mechanism wherein the casing 46a is linearly moved upward in the vertical direction and linearly drawn in the horizontal direction, no guide mechanism need be formed above the casing 46a, thereby obtaining an advantage in space.

The positioning mechanism 7 for a wafer will be described below.

Figure 8:
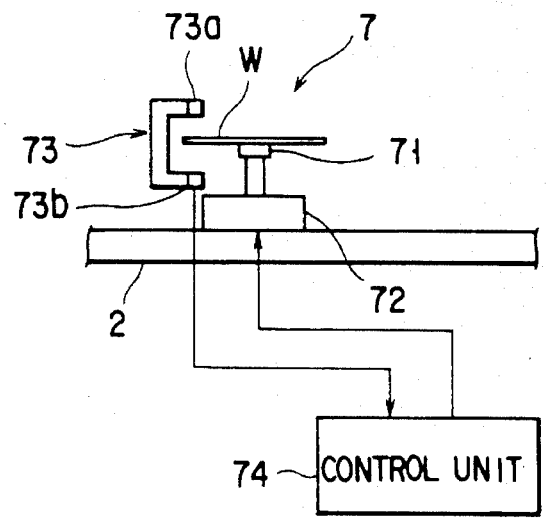
FIG. 8 is a view showing a positioning mechanism in the vacuum process apparatus in FIG. 1.

The positioning mechanism 7, as shown in FIG. 8, comprises a small-diameter stage 71 for holding a wafer w, a drive unit 72 for driving the stage 71 in X, Y, and Z directions and a θ direction (rotational direction), and a detection unit 73 having a light-emitting portion 73a and a light-receiving portion 73b which vertically sandwich the movement path of the peripheral portion of the wafer w to optically detect the peripheral portion of the wafer W.

The light-emitting portion 73a is connected to a control unit 74. This control unit 74 detects the central position of the wafer W and the direction of the orientation flat of the wafer w on the basis of a light-receiving signal from the light-receiving portion 73b, and has a function of controlling the drive unit 72 of the stage 71 such that the central portion of the wafer w is located at a predetermined position and the direction of the orientation flat is set to be a predetermined direction.

A processing operation in the vacuum process apparatus arranged as described above will be described below.

The gate valves G of the loading/unloading ports 21a, 21b, and 21c of the convey chamber 2 are closed, the valve V3 is opened, and the convey chamber 2 is evacuated through the exhaust pipe 26 to have a pressure of, e.g., 50 to 200 mTorr. The valve V3 is closed, the valve V2 is opened, the evacuation is continuously performed. In this case, the evacuation is performed using two paths, i.e., a path constituted by the bearing portion 64 of the pivot shaft 61, the case 65, and the exhaust pipe 36 and a path constituted by the bearing portions 52b and 53b of the joint portions of the convey means 5, the suction path 54, the case 65, and the exhaust pipe 36.

A system recipe is input to a host computer, and the lid portions 32 of the cassette chambers 3a and 3b are opened. A cassette C in which 25 wafers W serving as target objects are mounted is placed on the lift mechanism 33 in the loading cassette chamber 3a such that the postures of the wafers W are kept horizontal, an empty cassette C is placed in the unloading cassette chamber 3b, and the lid portions 32 are closed. The valves V1 of both the cassette chambers are opened, and the cassette chambers 3a and 3b are evacuated. When the cassette chambers 3a and 3b are to be evacuated, in order to prevent particles from scattering, the cassette chambers 3a and 3b are slowly evacuated until the pressure of each cassette chamber reaches about 10 Torr. Normal evacuation is performed to set the pressure in each cassette chamber to be about 30 to 300 mTorr. When the pressure reaches the target pressure, the valve V1 is closed. Simultaneously with this evacuation, the detection device (not shown) arranged in the cassette chamber 3a searches the wafers W placed in the cassette C to detect the states of the wafers W.

A nitrogen gas is supplied from the gas supply source 25 into the convey chamber 2 through the gas supply pipe 23 and the gas supply unit 24 such that the pressure in the convey chamber 2 is controlled to be set at 900 mTorr or less, e.g., 100 to 200 mTorr.

In this state, the gate valves G between the cassette chambers 3a and 3b and the convey chamber 2 are opened, and the arm 53 of the multi-joint arm member 5 is inserted into the cassette C of the cassette chamber 3a through the loading/unloading ports 21 to receive a wafer W. In this case, when the lift mechanism 33 is intermittently moved downward, the wafers W can be taken out from the cassette C one by one. The wafer W is held by the three projecting portions 55 (two of which can be seen in the side view of FIG. 4) of the holding portion 53c of the convey arm 53. In this case, the pressure in the convey chamber 2 is kept higher than that of each of the cassette chambers 3a and 3b.

In the convey chamber 2, the wafer W received by the convey arm 53 from the cassette C is placed on the stage 71 of the positioning mechanism 7, and the peripheral portion of the wafer W is detected by the detection unit 73. The stage 71 is moved on the basis of the result obtained from the detection unit 73 to perform positioning for the direction of the orientation flat of the wafer W and the central portion of the wafer W.

Subsequently, each of the vacuum process chambers 4a, 4b, and 4c is evacuated through an exhaust pipe 45 to have a pressure of 10 mTorr or less, and preferably, 1 mTorr or less. In this case, the pressure in the convey chamber 2 is kept higher than that of each of the vacuum process chambers 4a, 4b, and 4c. For example, the pressure of the convey chamber 2 is kept to be about 200 mTorr, and the pressure of each of the vacuum process chambers 4a to 4c is kept to be a 0.1-mTorr order.

The gate G corresponding to a process chamber, e.g., the process chamber 4a, which is predetermined from the process chambers 4a to 4c on the basis of the recipe is opened, and the wafer W is loaded into the vacuum process chamber 4a with the multi-joint arm member 5 through the loading/unloading port 21b.

In the vacuum process chamber 4a, the wafer W placed on the convey arm 53 is located above the lower electrode 42 serving as a susceptor, vertically movable pins (not shown) project to receive the wafer W, and the vertically movable pins are moved downward to place the wafer W on the lower electrode 42. The multi-joint arm member 5 is withdrawn from the vacuum process chamber 4a into the convey chamber 2, and the gate valve G is closed.

A process gas is supplied into the vacuum process chamber 4a through the gas supply pipe 44, and the RF power supply E applies RF power across the lower electrode 42 and the upper electrode 43. The obtained electric field and a magnetic field generated by the magnet 47 generate magnetron discharge between the electrodes 42 and 43, and the wafer W is subjected to an etching process by a plasma of the process gas excited at this time.

The wafers W in the cassette C are sequentially conveyed into each of the vacuum process chambers 4a to 4c one by one by the same procedure as described above in accordance with the recipe. Vacuum processes is (in this embodiment, a plasma etching processes) are performed in the process chambers 4a to 4c at the same time. At this time, when the gate valve of one of the process chambers is open, the gate valves of the remaining process chambers are preferably kept closed to prevent cross contamination. In addition, when the gate valve of a process chamber is to be opened, this process chamber must be evacuated in advance as a matter of course.

A processed wafer W is provided into the cassette C of the unloading cassette chamber 3b with the multijoint arm member 5. A wafer W to be processed next is positioned by the positioning mechanism 7 while processes are performed to the previous wafer in the vacuum process chambers 4a to 4c, and the wafer W to be processed next waits on the buffer stage 22.

The valve V2 is open through the whole vacuum process described above, thereby evacuating the case 65. As described above, the convey chamber 2 is sucked through the bearing portions 64, 52b, and 53b, and, at the same time, for example, a nitrogen gas is supplied from the inert gas supply unit 24 into the convey chamber 2, thereby controlling the pressure in the convey chamber 2 at a predetermined pressure. Since the inert gas supply unit 24 is located near a portion above the pivot shaft 61 of the convey means 5, the nitrogen gas mainly flows from the bearing portions 64, 52b, and 53b into the case 65 through the paths described above.

In the vacuum process apparatus described above, since the multi-joint arm 5 as a convey means having the convey arms 51 to 53 which are independently, horizontally movable is arranged in the convey chamber 2, the degree of freedom of the horizontal posture of the convey means is high, and a convey path for a wafer W conveyed by the convey arms 51 to 53 can be freely selected within the stroke range of each arm. Therefore, the degree of freedom of the positional relationships between the convey means 5 and the loading/unloading ports corresponding to the vacuum process chambers 4a to 4c and the cassette chambers 3a and 3b is set to be high. In addition, since the degree of freedom of the shape of the convey chamber 2 and the degree of freedom of the layout of the vacuum process chambers 4a to 4c and the cassette chambers 3a and 3b are high, the layout can be determined in accordance with a space for setting the vacuum process apparatus, thereby achieving a reduction in space. In addition, when the square convey chamber 2 is used, and a plurality of vacuum process chambers and cassette chambers are arranged around the convey chamber 2, a space for arranging the apparatus is smaller than that of a case wherein a plurality of vacuum process chambers and cassette chambers are radially arranged with respect to the center of rotation of a convey means. Therefore, the present invention is very effective when an apparatus obtained by combining a plurality of vacuum process chambers is installed in an expensive clean room. In addition, since the degree of freedom of the layout of the arrangement of the chambers is high, the length of a convey path for a wafer W can be shortened, and a throughput can be increased.

Since the drive unit 6 for the convey means 5 is sealed from the atmospheric air and stored in the case 65 kept airtight, a magnetic fluid seal or the like is not required as the bearing portion 64 of the pivot shaft 61. Evacuation is performed through the two paths, i.e., the path constituted by the bearing portion 64 of the pivot shaft 61, the case 65, and the exhaust pipe 36 and the path constituted by the bearing portions 52b and 53b of the joint portions of the convey means 5, the suction path 54, the case 65, and the exhaust pipe 36. In addition, an air flow is formed by supplying an inert gas such as nitrogen gas from a portion above the arm 51, so that the bearing portions 64, 52b, and 53b are blown by the inert gas. For this reason, since particles generated by the bearing portions by driving the multi-joint arm member 5 can be prevented from being scattered in the convey chamber 2, contamination of the wafers can be minimized. Therefore, the apparatus of the present invention is very effective as an apparatus for manufacturing a micropatterned semiconductor device. In addition, since a labyrinth seal is formed near the bearing portion 64, particles generated by the bearing portion 64 can be prevented from being scattered in the convey chamber 2, and the interior of the convey chamber can be kept more clean. Note that not only a nitrogen gas but also an argon gas or a helium gas may be used as the insert gas.

As described above, since the interior of the convey chamber 2 can be kept very clean, even when the pressure in the convey chamber 2 is set to be higher than that in each of the cassette chambers and the vacuum process chambers, the cassette chambers and the vacuum process chambers are not contaminated. In addition, when the positive pressure in the convey chamber 2 is set to be higher than that in each of the cassette chambers and the vacuum process chambers as described above, a contaminant from each process chamber is prevented from flowing into the convey chamber 2, and cross contamination in the convey chamber 2 is prevented from being formed.

When the buffer stage 22 is arranged in the convey chamber 2, convey efficiency can be improved such that a next wafer which has been positioned can be set in a standby state, and a throughput increases. In this case, when the buffer stage 22 is moved upward or downward such that a wafer in a convey state does not vertically interfere with the wafer on the buffer stage 22, the buffer stage 22 can be arranged near the convey path for conveying a wafer from a vacuum process chamber to the cassette C. Note that two positioning mechanisms 7 may be prepared to be also used as buffer stages.

When the vacuum process apparatus as described above is to be manufactured, or an assembling operation for the vacuum process apparatus is performed after maintenance is performed, a unit constituted by the convey chamber 2 and the cassette chambers 3a and 3b, and the units of the vacuum process chambers 4a to 4c are independently assembled in advance, and the assembled units can be combined with each other on the base 10. For example, in the unit of the vacuum process chamber 4a, the vacuum process chamber 4a is mounted on the support frame 40a, and required components are mounted on the support frame 40a, thereby assembling the unit. The same operation as described above is performed to other units, and support frames are mounted on the base 10 and respectively combined with each other in the units. In this manner, since the assembling operations for the units can be parallelly performed, the assembling operations can be performed within a short time. In addition, when the apparatus is to be partially replaced, e.g., when the vacuum process chamber 4a is to be replaced with a new one, good operability can be obtained because the support frame 40a can be replaced with a new one independently of other units.

Since gas pipes and electrical wiring lines are arranged in the base 10, each support frame can be easily carried and installed on the base 10 after the units of the vacuum process chambers and the like are assembled, and each support frame can be easily carried out of the base. In addition, when an operator performs an operation on the base 10, he/she can easily perform the operation because his/her legs are not tangled by electrical wiring lines and the like.

When any abnormality has occurred in the vacuum process chambers, e.g., when a process condition such as a gas flow rate or power is deviated from a predetermined value, an alarm is generated to stop a process. At this time, a reset process is performed in accordance with determination by an operator to restart the apparatus. If the abnormality is eliminated, a wafer whose process is stopped is returned to the cassette, and a normal process is performed from the subsequent wafers. Therefore, in this case, the wafer to which the normal process is not performed is included in the wafers returned to the cassette. The operator discriminates the cassette including the corresponding wafer from other cassettes in the basis of data sheets of a host computer, and he/she takes out the corresponding wafer from the cassette and disposes of it. However, this operation is very cumbersome.

In consideration of the point described above, a method of easily identifying a wafer to which normal process has not been performed will be described below.

When this method is to be performed, the positioning mechanism shown in FIG. 9 is used. This positioning mechanism is different from that shown in FIG. 8. In the positioning mechanism shown in FIG. 9, the control unit 74 selects a processing mode for designating the direction of an orientation flat determined in the basis of the vacuum process of the chamber 4a, 4b, or 4c or a storage identification mode for designating the direction of an orientation flat different from the direction of an orientation flat used when a wafer W to which a normal process has been performed is stored in the cassette C by, e.g., 180°. In addition, this control unit 74 controls the drive unit 6 of the convey means 5 and has a function of selecting a normal mode for performing a normal convey operation when the vacuum process chamber 4a (4b or 4c) is normal and selecting an abnormal mode in accordance with a command from a host computer 75 when an abnormality is detected on the vacuum process chamber to convey a wafer W to which the normal process has not been performed.

A convey process changes by checking whether the normal process is performed in the vacuum process chamber.

The flow of the wafer convey process performed at this time will be described with reference to FIG. 10. When a predetermined vacuum process is to be performed to a wafer W in the vacuum process chamber, process conditions such as the flow rate, temperature, and pressure of a process gas and power are managed by the host computer 75. When the normal process is performed to the wafer W in each process chamber as described above, the wafer W unloaded from the process chamber is stored in the cassette in the unloading cassette chamber 3b. In contrast to this, when the normal process is not performed, the above process conditions include an abnormal value, and an abnormal signal is output from the host computer 75 to the control unit 74. At this time, the control unit 74 selects the abnormal mode to control the drive unit 6, and the wafer W is conveyed onto the stage 71 of the positioning mechanism 7. The control unit 74 selects a storage identification mode for the positioning mechanism 7, thereby pivoting the stage 71 such that the wafer W is stored in the cassette C to have a direction different from the direction of the orientation flat of a normal wafer W. Thereafter, this wafer W is conveyed from the stage 71 into the cassette C in the cassette chamber 3b.

When the abnormality of the process in the vacuum process chamber in which an abnormality has occurred is eliminated by, e.g., a reset process, the remaining wafers in the wafer cassette C in the cassette chamber 3a are sequentially processed.

In the cassette C in the cassette chamber 3b in which the wafers W are stored through the above process, the direction of the orientation flat of the wafer W to which the normal process has not been performed is different from that of a wafer W to which the normal process has been performed by, e.g., 180°.

Therefore, when an operator watches this cassette C, he/she can immediately identify the wafer to which the normal process has not been performed, and he/she can reliably remove the corresponding wafer without removing a wafer to which the normal process has been performed. Unnecessary examination or stop of a manufacturing line need not be performed in the subsequent processes. Note that, when a wafer in which semi-circular cutoff called a notch is formed in place of an orientation flat is used, the direction of the wafer is determined on the basis of the notch.

The present invention is not limited to the above embodiment, and various changes and modifications can be effected. As a vacuum process chamber, not only a process chamber for performing etching using a magnet but also a process chamber for performing plasma etching without using a magnet, plasma CVD, thermal CVD, ashing, or sputtering may be used. Different vacuum processes may be performed in vacuum process chambers, respectively.

In a vacuum process chamber, wafers need not always be vacuum-processed under the same conditions, wafers may be processed under different conditions, respectively. A vacuum process apparatus capable of quickly coping with a change in process condition of a wafer to be processed will be described below.

When a vacuum process, e.g., a dry etching process, is to be performed by the same apparatus, various process conditions, e.g., RF power, the types of etching reaction gases, a flow rate ratio thereof, the degree of vacuum in a process chamber, a process temperature, and the like in the dry etching process change in accordance with the material, size, resist, pattern, specifications, and the like of a semiconductor wafer. For this reason, when the dry etching process is to be performed, an etching process apparatus must be operated to perform the dry etching process under various process conditions unique to semiconductor wafers serving as target objects.

Figure 11:
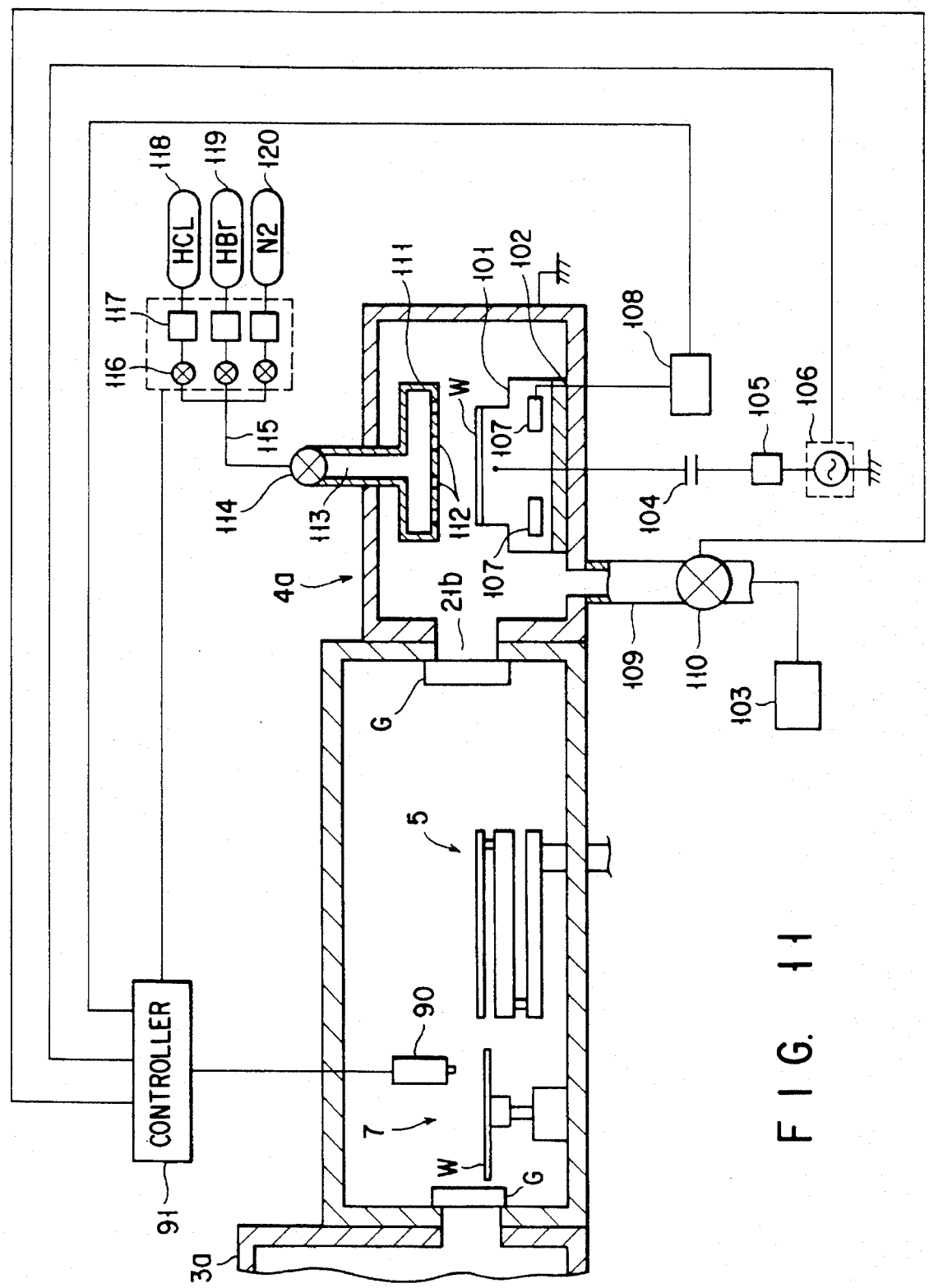
FIG. 11 is a sectional view showing the main part of a vacuum process apparatus according to another embodiment of the present invention.

FIG. 11 is a view showing an apparatus capable of setting process conditions in units of wafers.

A case wherein a dry etching apparatus in which a magnet is not used is employed in the process chamber 4a will be described below.

A read apparatus, e.g., a bar-code reader 90, utilizing a laser is arranged above the positioning mechanism 7. This bar-code reader 90 is constituted to be horizontally retracted. Upon completion of positioning performed by a positioning mechanism 7, the bar-code reader 90 is moved to a predetermined position above a wafer, reads a bar-code displayed at a predetermined position of the wafer, forms a signal on the basis information recognized by reading the bar-code, and outputs the signal to a controller 91.

In the vacuum process chamber 4a, a lower electrode 101 functioning as a susceptor for holding a wafer W conveyed through a loading/unloading port 21b is arranged. As a mechanism for holding the wafer W, an electrostatic chuck utilizing an electrostatic force which is generated by applying a DC voltage to, e.g., a dielectric material is employed.

This lower electrode 101 is formed of a material such as aluminum and is arranged on an insulating plate 102 arranged on the bottom portion of the vacuum process chamber 4a and consisting of a ceramic. The lower electrode 101 is insulated from the vacuum process chamber 4a which is grounded.

An RF power supply 106 is connected to the lower electrode 101 through a blocking capacitor 104 and a matching device 105, and RF power having a frequency of, e.g., 13.56 MHz and a power of an arbitrary value set within the range of 100 W to 1,500 W is applied to the lower electrode 101 by the RF power supply 106. An output from the RF power supply 106 is controlled by the controller 91.

A temperature adjustment mechanism 107 for upper electrode 111 opposing the susceptor 101 is formed of amorphous carbon. A large number of gas diffusion controlling the temperature of the lower electrode 101 to a predetermined temperature, e.g., an arbitrary temperature falling within the range of −30° C. to +60° C. is arranged in the lower electrode 101. This temperature adjustment mechanism 107 is controlled by a temperature control device 108 arranged outside the vacuum process chamber 4a, and the temperature control device 108 itself is controlled by the controller 91.

An exhaust pipe 109 is connected to the bottom portion of the vacuum process chamber 4a, and a vacuum pump 103 is connected to the exhaust pipe 109. An exhaust valve 110 is connected to the exhaust pipe 109. When the vacuum pump 103 and the valve 110 are operated, the interior of the vacuum process chamber 4a is set in an arbitrary reduced-pressure atmosphere having a pressure falling within the range of, e.g., $10^{-2}$ to $10^{-1}$ Torr, and this reduced-pressure atmosphere is kept. The operation, degree of opening/closing, and the like of the exhaust valve 110 are controlled by the controller 91.

An upper electrode 111 is arranged to oppose the lower electrode 101 at the upper portion in the vacuum process chamber 4a. The upper electrode 111 has a hollow structure as a whole, and the surface of the upper electrode 111 opposing the susceptor 101 is formed of amorphous carbon. A large number of gas diffusion holes 112 are formed in the opposing surface. A process gas such as an etching gas supplied from a gas feed port 113 formed at the central upper portion of the upper electrode 111 uniformly blows the wafer W held on the lower electrode 101 through the gas diffusion holes 112.

The gas feed port 113 is connected to a gas supply pipe 115 through a valve 114, and the gas supply pipe 115 is branched into three pipes. Gas bombs 118, 119, and 120 respectively filled with different process gases are connected to the distal ends of the branched pipes through valves 116 and mass-flow controllers 117, respectively. According to this embodiment, an HCl gas, an HBr gas, and an $N_2$ gas serving as an inert gas are filled in the gas bombs 118, 119, and 120, respectively.

The valves 116 and the mass-flow controllers 117 are controlled by the controller 91.

Figure 12:
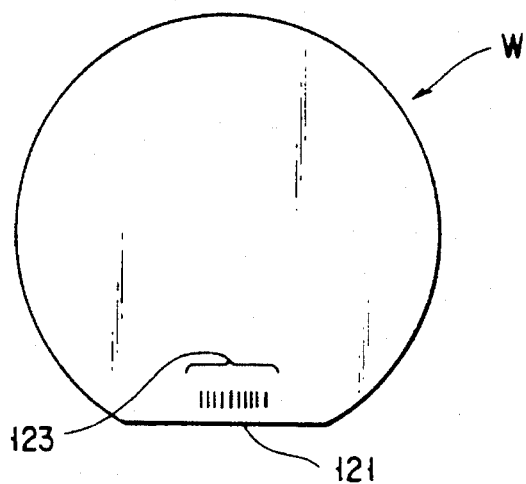
FIG. 12 is a view showing a semiconductor wafer applied to the apparatus in FIG. 11.

In the above vacuum process apparatus, in order to perform an etching process, as shown in FIG. 12, near an orientation flat 121 of a wafer W serving as a target object, a bar-code 123 is displayed which is obtained by converting various unique conditions, e.g., RF power, the type of an etching reaction gas, and a flow rate ratio thereof, the degree of vacuum in a process chamber, and a process temperature used when the wafer w is subjected to a dry etching process, into information.

In this manner, a plurality of wafers $W_1$ to $W_{25}$ in which various process conditions unique to these semiconductor wafers are displayed as bar-codes are placed in a cassette C, and the cassette C is stored in a cassette chamber 3a. Thereafter, as in the embodiment described above, a convey chamber 2 and the cassette chamber 3a are evacuated, and the gate valve G arranged therebetween is opened. The wafer $W_1$ is conveyed into the convey chamber 2 by a multi-joint arm member in the convey chamber 2 first.

Upon completion of positioning of the orientation flat of the wafer $W_1$ by the positioning mechanism 7, the bar-code reader 90 is moved to a predetermined position above the wafer $W_1$, reads the bar-code displayed near the orientation flat of the wafer $W_1$ and having the information of the above various process conditions, and outputs the information to the controller 91.

In the controller 91, the input information representing the various process conditions unique to the wafer $W_1$ is calculated, and a command corresponding to the information is output to the RF power supply 106, the valve 110, the temperature control device 108, and the valves 116 and mass-flow controllers 117 of the process gas system.

After the vacuum process chamber 4a is evacuated, the gate valve G between the convey chamber 2 and the vacuum process chamber 4a is opened, and the wafer $W_1$ is placed on the lower electrode 101 in the vacuum process chamber 4a by the multi-joint arm member 5.

Thereafter, when the gate valve G is closed, the exhaust valve 110 is controlled to keep a reduced-pressure atmosphere suitable for a dry etching process for the wafer $W_1$, e.g., a 0.6-Torr, in the vacuum process chamber 4a.

At the same time, the temperature of the lower electrode 101 is controlled to be a predetermined temperature, e.g., 40° C., by the temperature control device 108 in accordance with the command from the controller 91, and, similarly, predetermined process gases are fed from the gas feed port 113 into the vacuum process chamber 4a at a predetermined flow rate ratio in accordance with the command from the controller 91. For example, when the resist coating rate of the wafer $W_1$ is 40%, HCl/HBr gases are fed into the vacuum process chamber 4a at a flow rate ratio of 200/20 SCCM.

Thereafter, the RF power supply 106 supplies RF power having, a power of 275 W and a frequency of 13.56 MHz to the lower electrode 101 in accordance with conditions set by the command from the controller 91, and an etching process is performed to the wafer $W_1$.

In this case, information of all the various process conditions are converted into the bar-code on the wafer $W_1$, various devices are controlled in accordance with the information, and process conditions of the devices are set in accordance with the information. For this reason, a very accurate etching process can be performed.

In this manner, upon completion of the predetermined etching process for the semiconductor wafer $W_1$, when an etching process is performed to the wafer $W_2$ serving as the next target object, the same process as described above is performed, and the wafer $W_2$ is processed under conditions unique to the wafer $W_2$.

For example, when the coating rate of the wafer $W_2$ is 7.4% unlike the processed wafer $W_1$, information of various process conditions corresponding to the coating rate are converted into a bar-code, and this bar-code is displayed on the surface of the semiconductor wafer $W_2$. For this reason, process conditions unique to the wafer $W_2$ are input in the controller 91 by a reading operation performed by the bar-code reader 90 upon completion of positioning of the orientation flat of the wafer $W_2$ by the positioning mechanism 7 in the convey chamber 2, and the RF power supply 106, the valve 110, the temperature control device 108, the valves 116 and mass-flow controllers 117 of the process gas system, and the like are set up on the basis of the process conditions. More specifically, since the wafer $W_2$ has a resist coating rate of 7.4%, the flow rate ratio of HCl/HBr gases, i.e., 200/80 SCCM, corresponding to the flow rate ratio is set.

Upon completion of the setup operation, when the wafer $W_2$ is placed on the lower electrode 101 in the vacuum process chamber 4a, the flow rate ratio of the HCl/HBr gases supplied into the vacuum process chamber 4a changes to 200/80 SCCM, and an etching process is started under the set conditions. As described above, a corresponding appropriate process is automatically, correctly performed to the wafer $W_2$ which is subjected to a process under the conditions different from those of the wafer $W_1$.

In this manner, the remaining wafers $W_3$ to $W_{25}$ having different process conditions unique to the wafers $W_3$ to $W_{25}$ are subjected to appropriate etching processes by automatically changing process conditions. In addition, when each etching process is performed, a bar-code can always be correctly read because the bar-code is read upon completion of positioning of the corresponding semiconductor wafer.

In the above embodiment, although the wafers $W_1$ and $W_2$ have the same process conditions except for the flow rate ratio of process gases, even when the power of RF power, a temperature, a reduced-pressure atmosphere, and the like are changed, and when the changes in conditions are converted into information as a bar-code and displayed on a semiconductor wafer serving as a target object, the present invention can appropriately cope with the changes in conditions.

In the above embodiment, a case wherein information indexed as a bar-code is related to so-called environmental conditions of a process performed to a target object is described. However, the present invention is not limited to this embodiment, and the present invention can be applied to a case wherein different process sequences performed by a plurality of vacuum process chambers are performed to different target objects.

For example, assuming that the vacuum process chamber 4a is a washing process device, that a vacuum process apparatus 4b is an etching process device, and that the vacuum process chamber 4c is a CVD process device, when unique independent processes are to be performed to wafers, respectively, and each required independent process is converted into information, e.g., as a barcode, as described above and displayed on the surface of a corresponding one of semiconductor wafers, all the following processes can be automatically performed. That is, a wafer is subjected to a washing process in the process chamber 4a, another wafer is subjected to the washing process in the process chamber 4a and then subjected to an etching process in the process chamber 4b, and still another wafer is subjected to a washing process in the process chamber 4a, an etching process in the process chamber 4b, and then a CVD process in the process chamber 4c.

In the above case, in each process chamber, process conditions can be set and changed in units of wafers.

In the above embodiment, although a bar-code is used as an index for converting process conditions or the like into information and displaying it, the process conditions are not limited to this, and the process conditions may be displayed by, e.g., numbers, letters, signs such as image symbols, or figures. In this case, as a reading means, a device utilizing an image processing means may be used.

The above index obtained by converting the conditions into information can be displayed on a target object, e.g., a semiconductor wafer, simultaneously with formation of a mask. When the index is to be displayed, another special process need not be added.

Figure 13B:
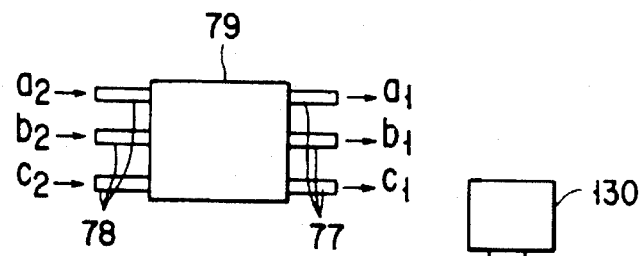
FIG. 13 is a view showing an evacuation system and a coolant circulation system for a plurality of vacuum process chambers.
Figure 13A:
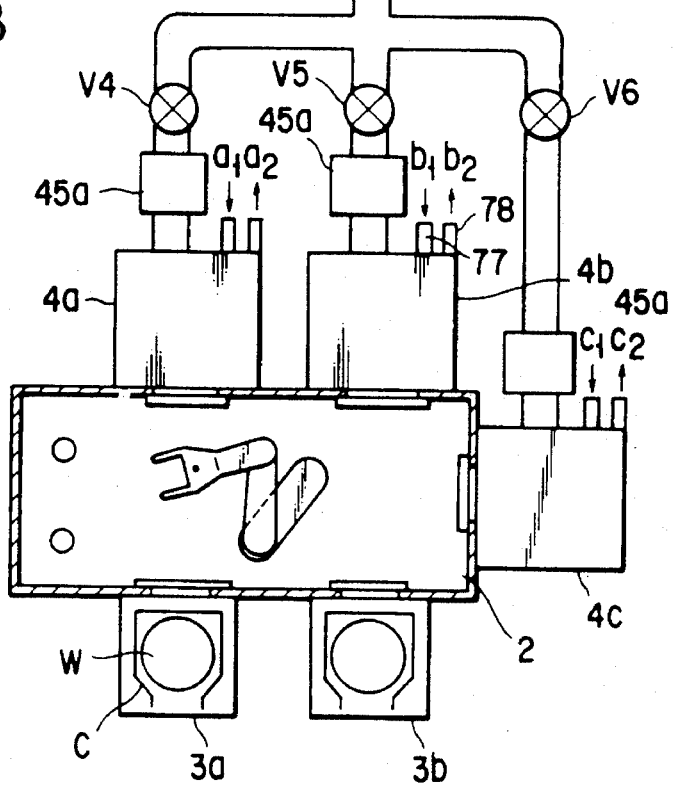

In the apparatus shown in FIG. 1, in order to obtain a reduction in space and a reduction in cost, as shown in FIG. 13, it is preferable that a coolant circulation device and a dry pump be commonly used for the plurality of vacuum process chambers. More specifically, a coolant supply pipe 77 and a coolant exhaust pipe 78 of each of the vacuum process chambers 4a to 4c are preferably connected to a common coolant circulation device 79, and the exhaust sides of the main pumps, e.g., turbo molecular pumps 45a, of the vacuum process chambers are preferably connected to one auxiliary pump, e.g., a dry pump 130, for adjusting the pressures of the exhaust sides of the turbo molecular pumps 45a through valves V4 to V6, respectively.

when a vacuum pump 35, e.g., a turbo molecular pump, is arranged on the lower side of the bottom surface of the convey chamber 2 along the vertical direction, as shown in FIG. 14, a jack mechanism 133 is preferably arranged at the lower portion of the vacuum pump 35, and the jack mechanism 133 is preferably arranged to be incorporated in a movable frame member 135 having casters 134. With this arrangement, since the vacuum pump 35 having a large weight can be moved downward by the jack mechanism 133 and drawn in the horizontal direction, the vacuum pump 35 can be easily detached/attached. This is convenient in maintenance of the apparatus.

As shown in FIG. 15, when a butterfly valve VA, a gate valve VB, and the vacuum pump 45a, e.g., a turbo molecular pump, are to be arranged on a side wall of the vacuum process chamber 4a (4b or 4c) along the horizontal direction, as shown in FIG. 15, for example, horizontal guide rails 136 are preferably arranged on a support frame 40a, and the vacuum pump 45a is preferably mounted on a movable table 138 having wheels 137 which are guided by the guide rails and horizontally moved. In this case, since the vacuum pump 45a can be easily drawn in the lateral direction, this arrangement is convenient in maintenance of the butterfly valve VA, the gate valve VB, and the vacuum pump 45a.

Figure 16:
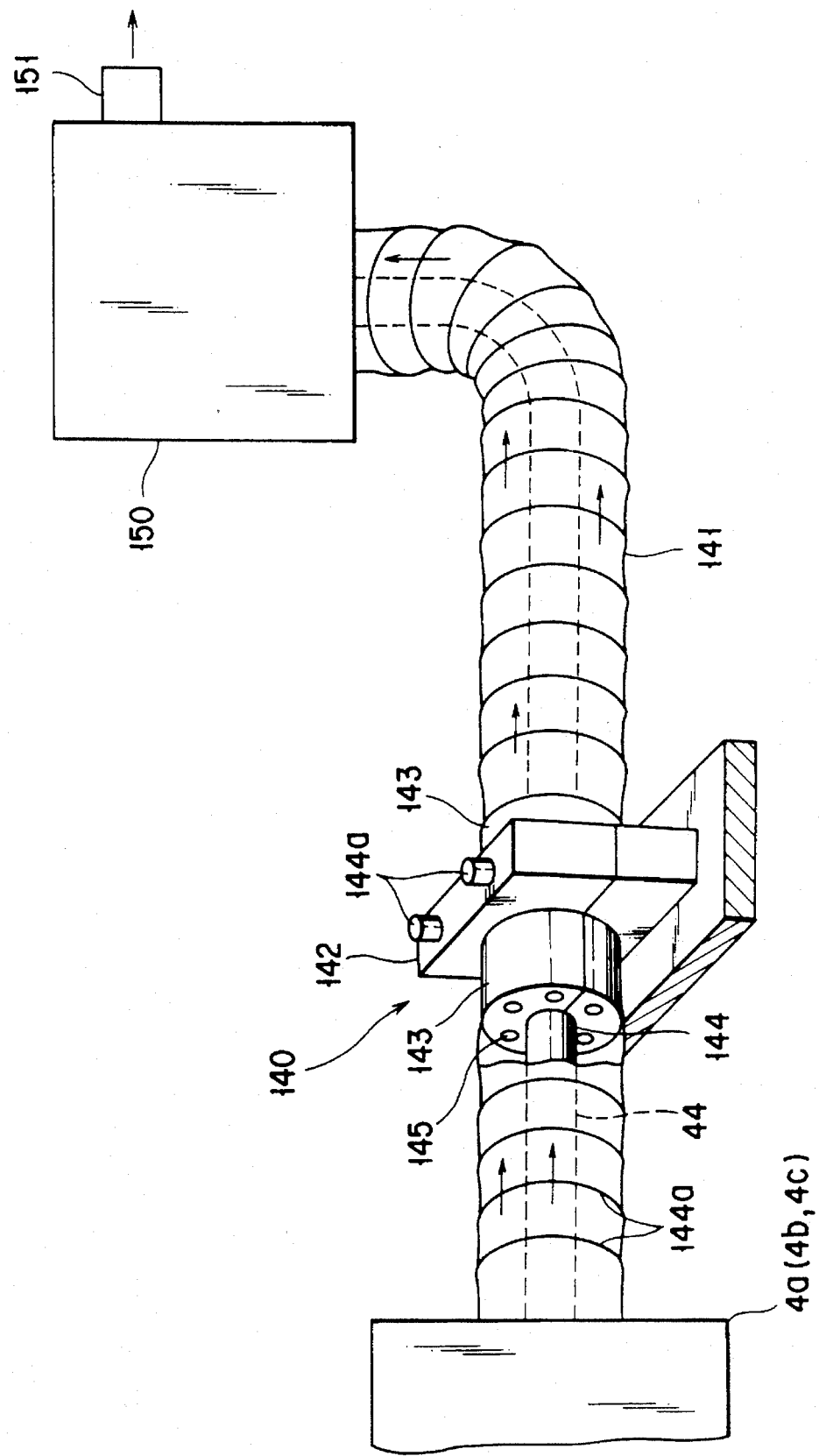
FIG. 16 is a perspective view showing a fixing structure for a process gas supply system having a double piping structure.

On the other hand, a process gas supply pipe 44 is generally inserted in a tube consisting of a plastic material, e.g., a resin tube to prevent leakage of a process gas, thereby constituting a double piping structure. This resin tube is always evacuated and set at a negative pressure. FIG. 16 shows a preferable arrangement used when the double piping structure is fixed. A double piping structure obtained by inserting the process gas supply pipe 44 in a resin tube 141 is arranged between the vacuum process chamber 4a (4b or 4c) and a gas box 150 having a unit portion for controlling a gas flow rate or a gas pressure. Note that rings 141a are arranged in the resin tube 141 to prevent the resin tube 141 being contracted by the negative pressure. A fixing member 140 is arranged midway along the double piping structure, and the fixing member 140 is constituted as described follows. That is, ring-like portions 143 are formed at the front and back (front and rear surfaces) of a large-diameter portion, e.g., a square plate-like portion 142 having a large thickness, and the fixing member 140 can be radially divided into two pieces.

In the central portion of the plate-like portion 142, as shown in FIG. 17, a through hole 144 matched with the process gas supply pipe 44 is formed, the fixing member 140 is fitted on the external peripheral surface of the process gas supply pipe 44 such that the process gas supply pipe 44 is sandwiched by the divided fixing member pieces 140a and 140b, and the fixing member pieces 140a and 140b are fixed to each other by bolts 144a (not shown in FIG. 17) and fixed on a tube fixing portion, e.g., a base plate in the base 10. The resin tube 141 is divided into two pieces in the longitudinal direction of the resin tube 141, and the ends of the divided pieces are fitted on the outer peripheral surfaces of the ring-like portions 143. In addition, ventilation paths 145 extending from one of the ring-like portions 143 to the other through the plate-like portion 142 are coaxially formed such that ventilation is allowed from one of the divided pieces to the other.

When the gas box 150 is evacuated by an exhaust pipe 151 connected to the gas box 150, the resin tube 141 is evacuated as indicated by an arrow in FIG. 16. In this manner, when the double piping structure is fixed, a fixing member smaller than that used in a conventional case wherein a double piping structure is fixed using a sheet-plate box can be used. For this reason, a space can be efficiently used. In addition, when the fixing member is arranged on a support frame or arranged at a position where people pass, an operation in maintenance is not easily disturbed.

Various methods of supplying process gases can be employed. A preferable method of supplying a process gas will be described below with reference to FIG. 18. In a gas box 160, e.g., 5 gas supply systems (gas lines) L1 to Ln are arranged, and control machines such as valves, a flowmeter, and a pressure gauge are incorporated in each of the gas supply systems L1 to Ln. Referring to FIG. 18, these control components are omitted, reference symbols Va to Vc denote valves and reference symbol MFC denotes a mass-flow controller. Note that valves Vc are arranged in pipes which are arranged between the gas supply systems L1 to Ln and connect the gas supply systems L1 to Ln to each other, respectively. In this case, assuming that n=3 and that the gas supply systems L1 to L3 are used for supplying a nitrogen gas, the first process gas, and the second process gas (different from the first process gas), the first process gas had been used, and a process using the second process gas is to be performed. At this time, the valves Vb of the gas supply systems L1 to L3 are closed, the valves Va and Vc are opened, and a valve 161 of the upper electrode 43 is opened, so that the vacuum process chamber 4a (4b or 4c) is evacuated through a process gas supply pipe 44. For example, the valve Vb of the gas supply system L1 is opened, and a nitrogen gas is supplied at a predetermined flow rate. In this manner, the control components such as valves and mass-flow controllers and pipes of the gas supply systems L1 to Ln are evacuated, and the nitrogen gas is circulated in the control components and pipes. When the process described above is performed once or a plurality of times, a residual gas in the control components and pipes can be reliably removed. Therefore, when the second process gas flows, another gas is prevented from being mixed in the second process gas, and an impurity can be prevented from being mixed in a wafer W. Note that, in this case, another inert gas may be used in place of the nitrogen gas.

Figure 19:
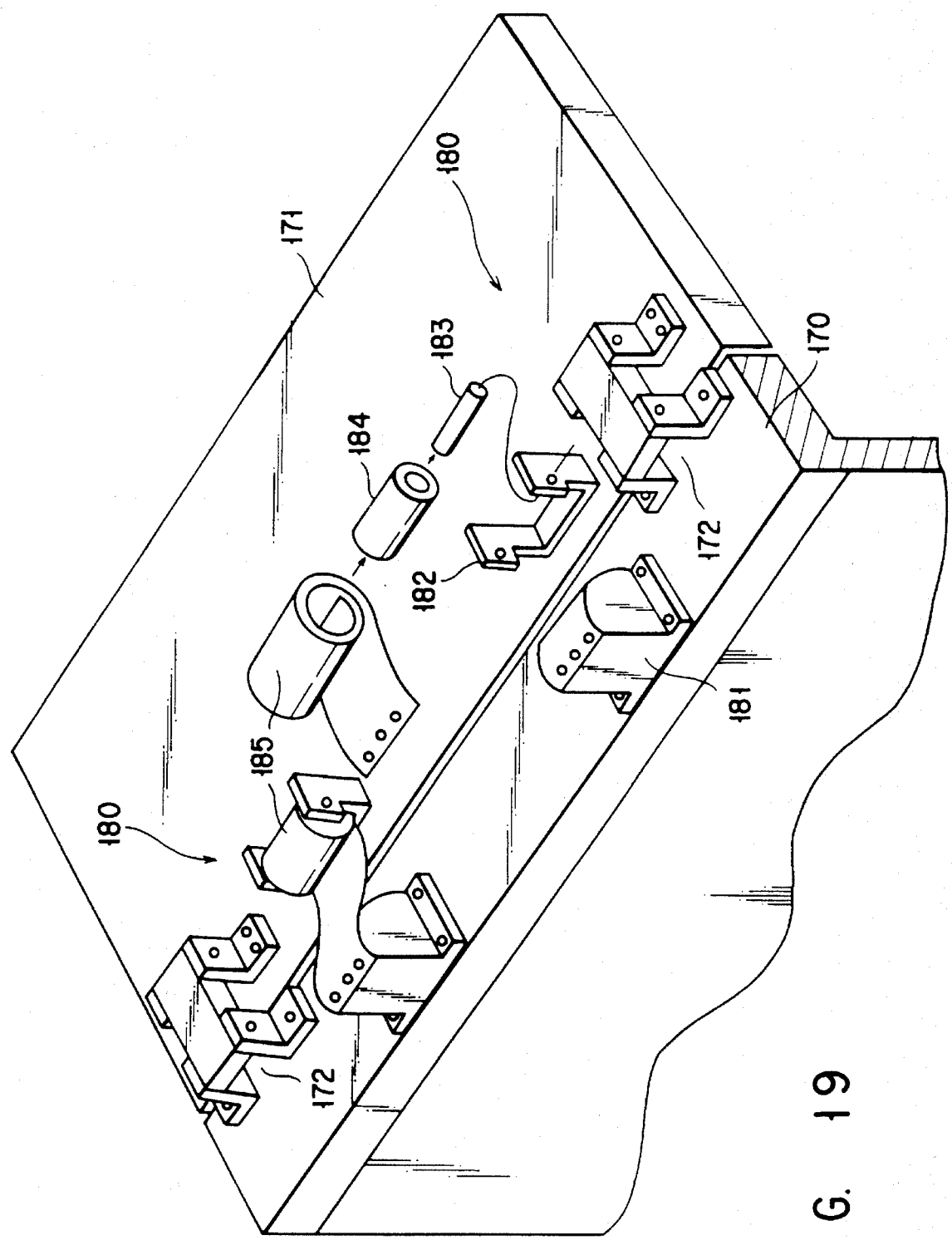
FIG. 19 is a perspective view showing the hinge mechanism of the lid portion of a vacuum chamber such as a vacuum process chamber or a cassette chamber.

A preferable example of the hinge mechanism of the lid portion of a vacuum chamber such as the convey chamber or the cassette chamber will be described below with reference to FIG. 19. Reference numeral 170 denotes part of an upper wall constituting the upper surface of a vacuum chamber, and reference numeral 171 denotes a lid portion for opening/closing the upper surface of the vacuum chamber. The lid portion 171 is constituted such that the lid portion 171 can be opened/closed by left and right hinges 172. Left and right leaf spring mechanisms 180 are arranged between the lid portion 171 and the upper wall of the vacuum chamber. Each of the leaf spring mechanisms 180 is constituted as follows. That is, a drum portion 181 having a shape obtained by dividing a circular cylinder in the circumferential direction into four pieces is fixed on the upper wall 170 such that the circumferential surface faces to the lid portion 171 side, a roller base 182 is formed on the lid portion 171, and a roller 184 is rotatably arranged through a roller shaft 183 parallel to the roller base 182. Moreover, a leaf spring 185 is wound on the roller 184, and the distal end portion of the leaf spring 185 is drawn from the lower side of the roller 184 and then arranged and fixed along the circumferential surface of the drum portion 181.

With the above arrangement, since the restoration force of the leaf spring 185 causes a force to act on the lid portion 171 in the direction of opening, the lid portion 171 can be opened/closed by a force obtained by subtracting the force corresponding to the restoration force of the leaf spring 185 from the force corresponding to the weight of the lid portion 171. Therefore, the thick, large, heavy lid portion 171 which can with-stand vacuum can be easily opened/closed, and safety can be improved.

The above leaf spring mechanism 180 may have the following arrangements. That is, as shown in FIG. 20, the drum portion 181 may be formed at the proximal end portion of the lid portion 171, and the roller 184 may be arranged on a side portion of the upper wall 170 of the vacuum chamber; as shown in FIG. 21, the drum portion 181 may be arranged on the upper wall 170, and the roller 184 may be arranged on a side portion of the lid portion 171. Reference symbol P denotes the central pivot portion of a hinge 170. In addition, the leaf spring mechanism 180 also has the following arrangements. That is, as shown in FIGS. 22 and 23, the roller 184 may be arranged on a side wall of the vacuum chamber, and the drum portion 181 may be arranged at the proximal end portion of the lid portion 171. As shown in FIG. 24, a projecting portion 174 may be vertically formed on the upper surface of the vacuum chamber, and the drum portion 181 may be arranged on the projection portion 174.

Although a wafer is used as a target object in the above apparatus, the target object is not limited to the wafer, and an LCD substrate or the like may be used as the target object.

The layout of vacuum process chambers and cassette chambers is not limited to the above embodiments. For example, the following layout can be employed. That is, as shown in FIG. 25, two vacuum chambers 4a and 4b are arranged on a given long side of a convey chamber 2 having a rectangular planar shape, two vacuum chambers 4c and 4d are arranged on the long side opposing the given long side, and cassette chambers 3a and 3b are arranged on the opposing short sides of the convey chamber 2.

In the above case, although the cassette chambers 3a and 3b are used as preliminary vacuum chambers, each preliminary vacuum chamber is not limited to a cassette chamber, a load lock chamber for placing only one wafer or another convey chamber having a convey means may be used as the preliminary vacuum chamber.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A vacuum process apparatus comprising:

a convey chamber having a plurality of loading/unloading ports and an airtight structure kept in a vacuum when a target object is conveyed;

at least one preliminary vacuum chamber connected to said convey chamber through one of said plurality of loading/unloading ports;

a plurality of vacuum process chambers each connected to said convey chamber through a respective one of said plurality of loading/unloading ports and each having a vacuum process mechanism;

a plurality of opening/closing means for opening/closing said plurality of loading/unloading ports;

convey means, arranged in said convey chamber and having a multi-joint arm member, for conveying the target object between said convey chamber and said vacuum process chambers, and between said convey chamber and said preliminary chamber;

a plurality of first support frames for independently supporting said plurality of vacuum process chambers;

a second support frame, arranged independently of said first support frames, for supporting said convey chamber; and a base on which said first support frames and said second support frame are mounted.

2. An apparatus according to claim 1, wherein said convey chamber has a rectangular cross-section.

3. An apparatus according to claim 1, wherein said convey means includes a main pivot shaft and a bearing for the main pivot shaft, the apparatus further including drive means connected to the main pivot shaft for driving the convey means and evacuation means for evacuating said conveyed chamber through said bearing portion.

4. A vacuum process apparatus comprising:

a convey chamber having a plurality of loading/unloading ports and an airtight structure kept in a vacuum when a target object is conveyed;

at least one preliminary vacuum chamber connected to said convey chamber through one of said plurality of loading/unloading ports;

a plurality of vacuum process chambers each connected to said convey chamber through a respective one of said plurality of loading/unloading ports and each having a vacuum process mechanism;

a plurality of opening/closing means for opening/closing said plurality of loading/unloading ports;

convey means, arranged in said convey chamber and having a convey arm and a main pivot shaft for horizontally pivoting said convey arm and a bearing portion for the main pivot shaft, for conveying the target object between said convey chamber and said vacuum process chambers, between said convey chamber and said preliminary chamber;

a drive device, arranged outside said convey chamber and connected to the main pivot shaft, for driving said convey means;

evacuation means for evacuating said convey chamber through said bearing portion; and wherein a labyrinth seal is arranged near said bearing portion for the main pivot shaft, and said evacuation means evacuates said convey chamber through a tortuous exhaust path formed by said labyrinth seal.

5. An apparatus according to claim 4, wherein said convey camber has a rectangular shape, and at least two of said vacuum process chambers are arranged along one side of said convey chamber.

6. An apparatus according to claim 4, wherein said preliminary vacuum chamber is a vessel placing chamber for placing a target object mounting vessel, has a lid portion for inserting the target object mounting vessel, and communicates with the atmospheric air through the lid portion.

7. An apparatus according to claim 4, further comprising:

a plurality of first support frames for independently supporting said plurality of vacuum process chambers;

a second support frame, arranged independently of said first support frames, for supporting said convey chamber; and a base on which said first support frames and said second support frame are mounted.

8. A vacuum process apparatus comprising:

a convey chamber having a plurality of loading/unloading ports and an airtight structure kept in a vacuum when a target object is conveyed;

at least one preliminary vacuum chamber connected to said convey chamber through one of said plurality of loading/unloading ports;

a plurality of vacuum process chambers each connected to said convey chamber through a respective one of said plurality of loading/unloading ports and each having a vacuum process mechanism;

a plurality of opening/closing means for opening/closing said plurality of loading/unloading ports;

convey means, arranged in said convey chamber and having a convey arm and a main pivot shaft for horizontally pivoting said convey arm and a bearing portion for the main pivot shaft, for conveying the target object between said convey chamber and said vacuum process chambers, and between said convey chamber and said preliminary chamber;

a drive device, arranged outside said convey chamber and connected to the main pivot shaft, for driving said convey means;

evacuation means for evacuating said convey chamber through said bearing portion; and a case which covers said drive unit, which is sealed from atmospheric air, and which communicates with said convey chamber through said bearing portion, and wherein said evacuation means evacuates said case.

9. An apparatus according to claim wherein said convey means comprises a multi-joint arm member having at least three arms, at least two pivot shafts for connecting the arms to each other, bearing portions for the pivot shafts, and a suction path which communicates with said case through interiors of said bearing portions, interiors of the arms, and interior of the main pivot shaft.

10. An apparatus according to claim 9, wherein a labyrinth seal is arranged near said bearing portion for the main pivot shaft, and said evacuation means evacuating said convey chamber through a tortuous exhaust path formed by said labyrinth seal.

11. An apparatus according to claim 9, further comprising inert gas supply means, arranged in said convey chamber, for supplying an inert gas into said convey chamber, so that the inert gas is supplied in at least a convey operation and sucked into said case through said suction path.

12. The apparatus of claim 9, wherein said convey chamber has a rectangular cross-section.

13. A vacuum process apparatus comprising:

a convey chamber having a plurality of loading/unloading ports and an airtight structure kept in a vacuum when a target object is conveyed;

at least one preliminary vacuum chamber connected to said convey chamber through one of said plurality of loading/unloading ports;

a plurality of vacuum process chambers each connected to said convey chamber through a respective one of said plurality of loading/unloading ports and each having a vacuum process mechanism;

a plurality of opening/closing means for opening/closing said plurality of loading/unloading ports; and convey means, arranged in said convey chamber, for conveying the target object between said convey chamber and said vacuum process chambers, and between said convey chamber and said preliminary chamber, wherein said convey chamber has a pressure kept higher than that of each of said preliminary vacuum chamber and said vacuum process chambers; and a plurality of first support frames for independently supporting said plurality of vacuum process chambers;

a second support frame, arranged independently of said first support frames, for supporting said convey chamber; and a base on which said first support frames and said second support frame are mounted.

* * * * *